(12) United States Patent
Rofougaran

(10) Patent No.: US 7,706,759 B2
(45) Date of Patent: Apr. 27, 2010

(54) RF RECEPTION SYSTEM WITH PROGRAMMABLE IMPEDANCE MATCHING NETWORKS AND METHODS FOR USE THEREWITH

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 732 days.

(21) Appl. No.: 11/700,829

(22) Filed: Jan. 30, 2007

(65) Prior Publication Data

US 2008/0180347 A1    Jul. 31, 2008

(51) Int. Cl.
*H04B 1/04* (2006.01)
*H04B 1/18* (2006.01)
*H03H 7/38* (2006.01)

(52) U.S. Cl. .............. 455/121; 455/123; 455/193.1; 455/275; 455/289; 333/32; 333/124

(58) Field of Classification Search .......... 455/77, 455/120, 121, 123, 266, 275, 289, 290, 291
See application file for complete search history.

(56) References Cited

U.S. PATENT DOCUMENTS

| | | | | |
|---|---|---|---|---|
| 5,589,844 A * | 12/1996 | Belcher et al. | .............. | 343/860 |
| 6,009,314 A * | 12/1999 | Bjork et al. | .............. | 455/83 |
| 6,049,702 A * | 4/2000 | Tham et al. | .............. | 455/78 |
| 6,072,993 A * | 6/2000 | Trikha et al. | .............. | 455/78 |
| 6,115,585 A * | 9/2000 | Matero et al. | .............. | 455/78 |
| 6,541,996 B1 * | 4/2003 | Rosefield et al. | .............. | 326/30 |
| 6,547,351 B1 * | 4/2003 | Wilson | .............. | 347/9 |
| 6,756,858 B2 * | 6/2004 | Gonzalez et al. | .............. | 333/17.3 |
| 6,771,475 B2 * | 8/2004 | Leete | .............. | 361/56 |
| 6,836,144 B1 * | 12/2004 | Bui et al. | .............. | 326/32 |
| 6,952,134 B2 * | 10/2005 | Burns et al. | .............. | 330/261 |
| 7,057,472 B2 * | 6/2006 | Fukamachi et al. | .............. | 333/101 |
| 7,119,631 B2 * | 10/2006 | Castaneda et al. | .............. | 333/32 |
| 7,215,932 B2 * | 5/2007 | Bhatti | .............. | 455/127.1 |
| 7,417,515 B2 * | 8/2008 | Chominski | .............. | 333/105 |
| 2004/0104785 A1 * | 6/2004 | Park et al. | .............. | 333/33 |
| 2006/0063493 A1 * | 3/2006 | Yanduru et al. | .............. | 455/77 |
| 2007/0024377 A1 * | 2/2007 | Wang et al. | .............. | 330/305 |
| 2008/0146175 A1 * | 6/2008 | Rakshani et al. | .............. | 455/129 |
| 2008/0180346 A1 * | 7/2008 | Rofougaran | .............. | 343/861 |
| 2008/0181144 A1 * | 7/2008 | Rofougaran | .............. | 370/297 |
| 2008/0182540 A1 * | 7/2008 | Rofougaran | .............. | 455/280 |

* cited by examiner

*Primary Examiner*—Duc M Nguyen
(74) *Attorney, Agent, or Firm*—Garlick Harrison & Markison; Bruce E. Stuckman

(57) ABSTRACT

A (radio frequency) RF reception system includes an off-chip antenna interface and an integrated circuit. The an off-chip antenna interface includes at least one first off-chip impedance matching component, a filter, and at least one second off-chip impedance matching component. The integrated circuit includes an on-chip antenna interface that forms a first programmable impedance matching network with the at least one first off-chip impedance matching component, and forms a second programmable impedance matching network with the at least one second off-chip impedance matching component. The first programmable impedance matching network and the second programmable impedance matching network are programmable based on a frequency selection signal.

15 Claims, 19 Drawing Sheets

RF RECEPTION SYSTEM WITH PROGRAMMABLE IMPEDANCE MATCHING NETWORKS AND METHODS FOR USE THEREWITH

CROSS-REFERENCE TO RELATED APPLICATIONS

The present application is related to the following patent applications that are filed concurrently herewith, the contents of which are incorporated herein by reference thereto:

U.S. patent application Ser. No. 11/700,808, entitled, RF RECEPTION SYSTEM AND INTEGRATED CIRCUIT WITH PROGRAMMABLE IMPEDANCE MATCHING NETWORK AND METHODS FOR USE THEREWITH, filed on Jan. 30, 2009.

U.S. patent application Ser. No. 11/700,318, entitled, RF RECEPTION SYSTEM AND INTEGRATED CIRCUIT WITH PROGRAMMABLE FILTER AND METHODS FOR USE THEREWITH, filed on Jan. 30, 2009.

BACKGROUND OF THE INVENTION

1. Technical Field of the Invention

This invention relates generally to wireless communications systems and more particularly to radio transceivers used within such wireless communication systems.

2. Description of Related Art

Communication systems are known to support wireless and wire line communications between wireless and/or wire line communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna through an antenna interface and includes a low noise amplifier, one or more intermediate frequency stages, a filtering stage, and a data recovery stage. The low noise amplifier (LNA) receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

Many wireless communication systems include receivers and transmitters that can operate over a range of possible carrier frequencies. The antenna interface provides impedance matching to the antenna over this range of frequencies in order to maximize the transfer of the received signal to the receiver. This can be challenging if the range of possible carrier frequencies is wide and/or the impedance of the antenna varies significantly over this range of frequencies. Further limitations and disadvantages of conventional and traditional approaches will become apparent to one of ordinary skill in the art through comparison of such systems with the present invention.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

DETAILED DESCRIPTION OF THE INVENTION

Figure 1:
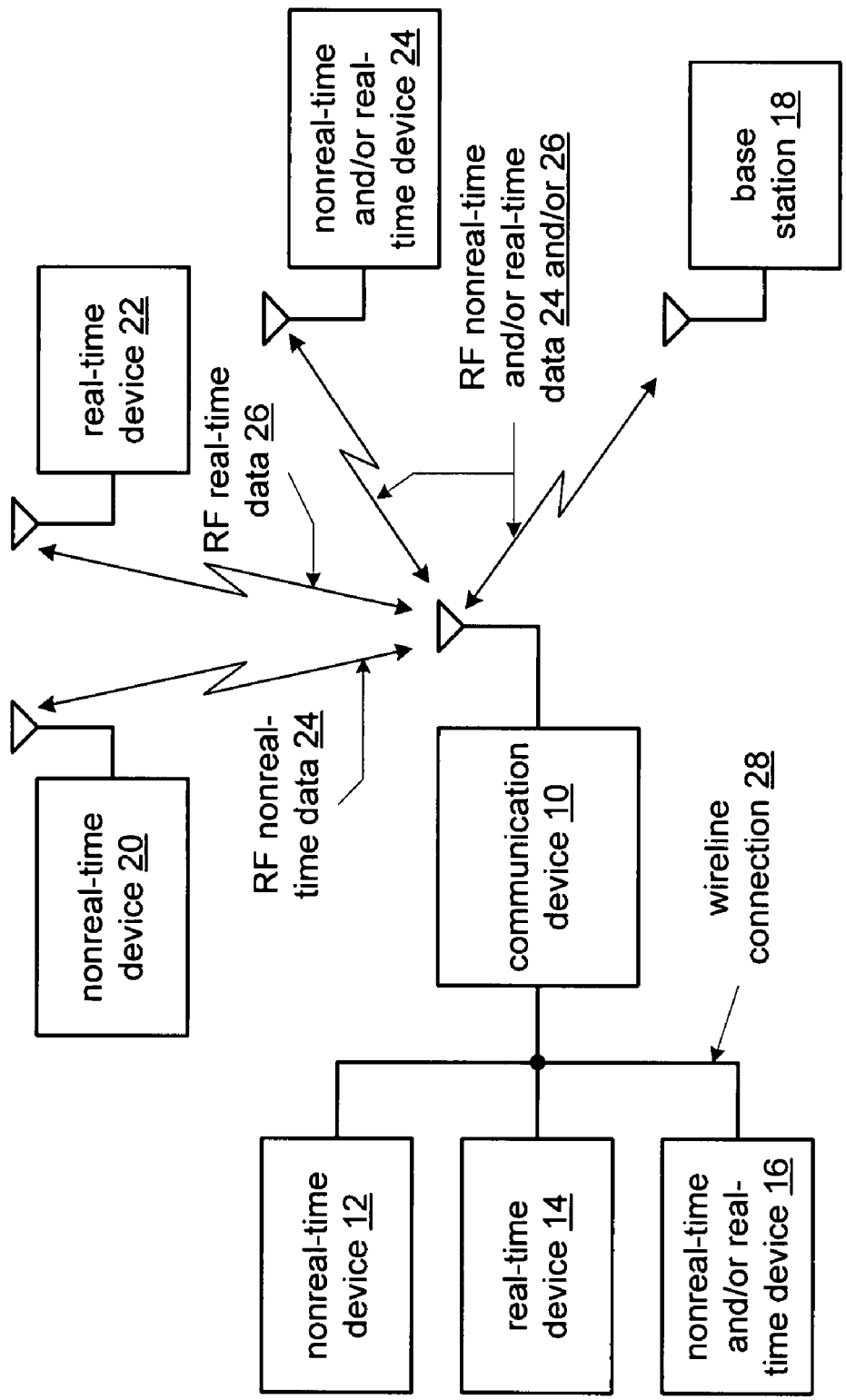
FIG. 1 is a schematic block diagram of a wireless communication system in accordance with the present invention.

FIG. 1 is a schematic block diagram of an embodiment of a communication system in accordance with the present invention. In particular a communication system is shown that includes a communication device 10 that communicates real-time data 24 and/or non-real-time data 26 wirelessly with one or more other devices such as base station 18, non-real-time device 20, real-time device 22, and non-real-time and/or real-time device 24. In addition, communication device 10 can also optionally communicate over a wireline connection with non-real-time device 12, real-time device 14 and non-real-time and/or real-time device 16.

In an embodiment of the present invention the wireline connection 28 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as IEEE 802.11, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 10.

Communication device 10 can be a mobile phone such as a cellular telephone, a personal digital assistant, game console, personal computer, laptop computer, or other device that performs one or more functions that include communication of voice and/or data via wireline connection 28 and/or the wireless communication path. In an embodiment of the present invention, the real-time and non-real-time devices 12, 14 16, 18, 20, 22 and 24 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 26 includes voice, audio, video and multimedia applications including Internet gaming, etc. The non-real-time data 24 includes text messaging, email, web browsing, file uploading and downloading, etc.

In an embodiment of the present invention, the communication device 10 includes an integrated circuit, such as a combined voice, data and RF integrated circuit that includes one or more features or functions of the present invention. Such integrated circuits shall be described in greater detail in association with FIGS. 3-22 that follow.

Figure 2:
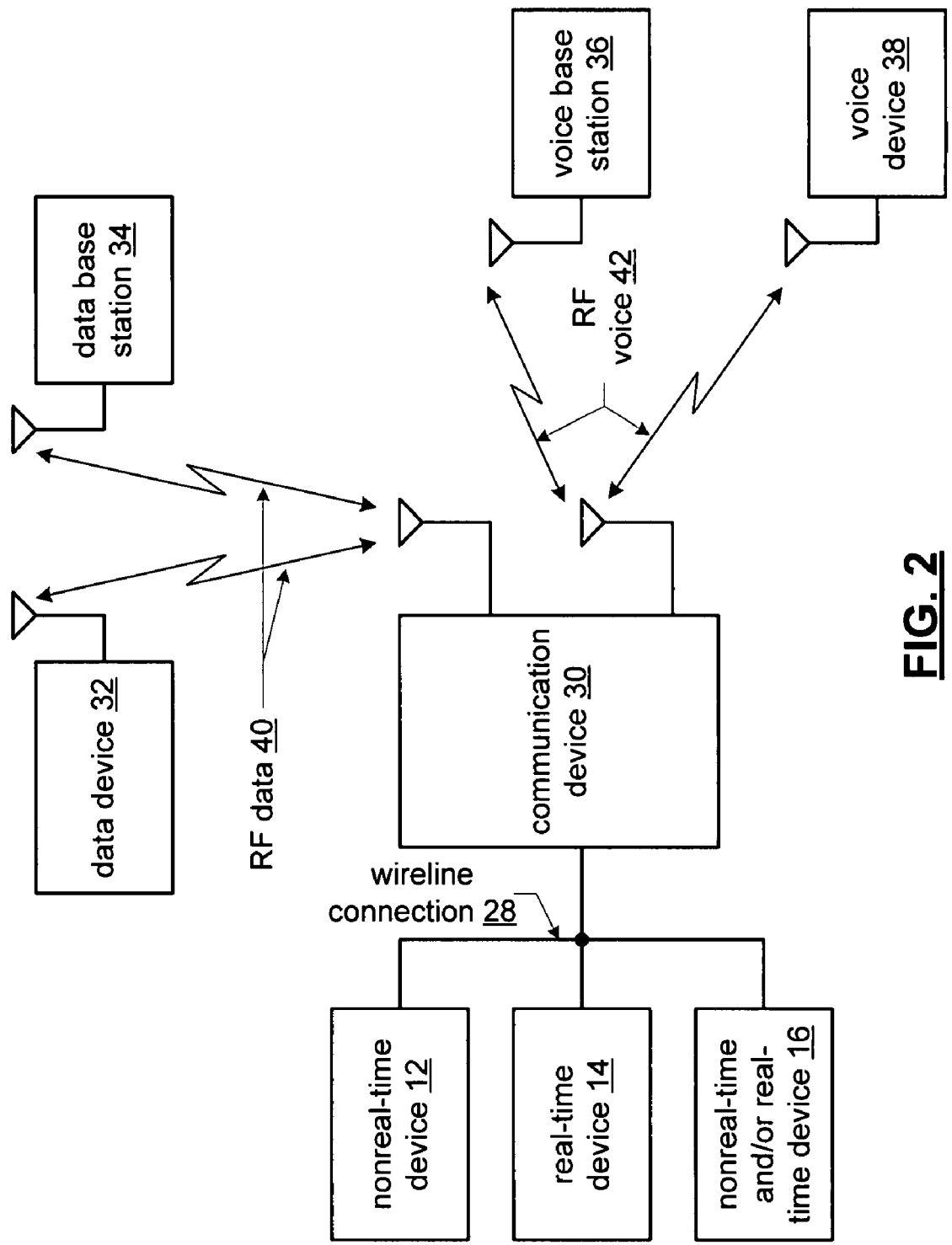
FIG. 2 is a schematic block diagram of a wireless communication system in accordance with the present invention.

FIG. 2 is a schematic block diagram of an embodiment of another communication system in accordance with the present invention. In particular, FIG. 2 presents a communication system that includes many common elements of FIG. 1 that are referred to by common reference numerals. Communication device 30 is similar to communication device 10 and is capable of any of the applications, functions and features attributed to communication device 10, as discussed in conjunction with FIG. 1. However, communication device 30 includes two separate wireless transceivers for communicating, contemporaneously, via two or more wireless communication protocols with data device 32 and/or data base station 34 via RF data 40 and voice base station 36 and/or voice device 38 via RF voice signals 42.

Figure 3:
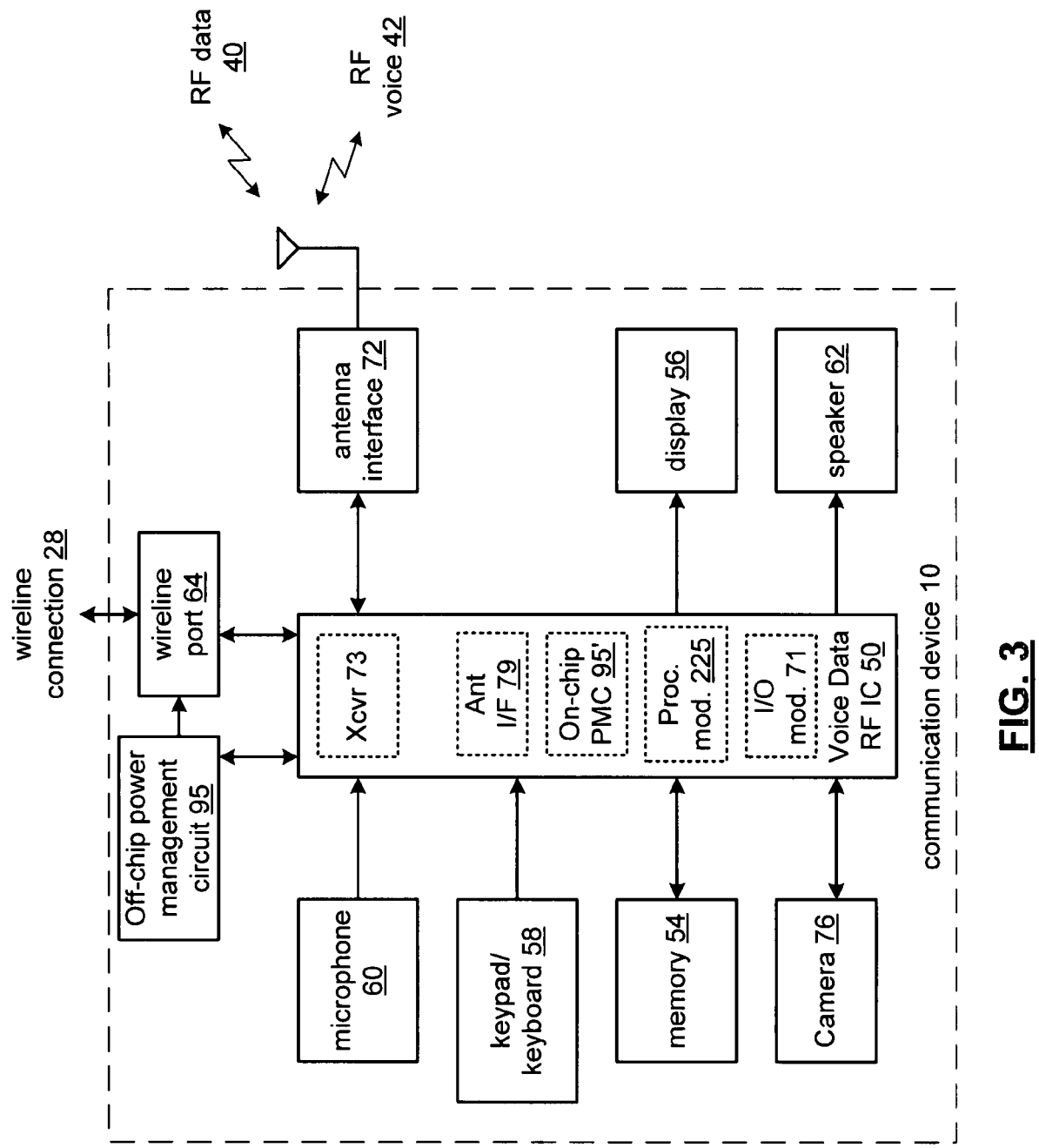
FIG. 3 is a schematic block diagram of a wireless communication device 10 in accordance with the present invention.

FIG. 3 is a schematic block diagram of an embodiment of an integrated circuit in accordance with the present invention. In particular, a voice data RF integrated circuit (IC) 50 is shown that implements communication device 10 in conjunction with microphone 60, keypad/keyboard 58, memory 54, speaker 62, display 56, camera 76, antenna interface 52 and wireline port 64. In operation, voice data RF IC 50 includes a transceiver 73 with RF and baseband modules for formatting and modulating data into RF real-time data 26 and non-real-time data 24 and transmitting this data via an antenna interface 72 and antenna. In addition, voice data RF IC 50 includes an input/output module 71 with appropriate encoders and decoders for communicating via the wireline connection 28 via wireline port 64, an optional memory interface for communicating with off-chip memory 54, a codec for encoding voice signals from microphone 60 into digital voice signals, a keypad/keyboard interface for generating data from keypad/keyboard 58 in response to the actions of a user, a display driver for driving display 56, such as by rendering a color video signal, text, graphics, or other display data, and an audio driver such as an audio amplifier for driving speaker 62 and one or more other interfaces, such as for interfacing with the camera 76 or the other peripheral devices.

Off-chip power management circuit 95 includes one or more DC-DC converters, voltage regulators, current regulators or other power supplies for supplying the voice data RF IC 50 and optionally the other components of communication device 10 and/or its peripheral devices with supply voltages and or currents (collectively power supply signals) that may be required to power these devices. Off-chip power management circuit 95 can operate from one or more batteries, line power and/or from other power sources, not shown. In particular, off-chip power management module can selectively supply power supply signals of different voltages, currents or current limits or with adjustable voltages, currents or current limits in response to power mode signals received from the voice data RF IC 50. Voice Data RF IC 50 optionally includes an on-chip power management circuit 95' for replacing the off-chip power management circuit 95.

In an embodiment of the present invention, the voice data RF IC is a system on a chip integrated circuit that includes at least one processing device. Such a processing device, for instance, processing module 225, may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip such as memory 54. Such a memory device may be a read-only memory, random access memory, volatile memory, non-volatile memory, static memory, dynamic memory, flash memory, and/or any device that stores digital information. Note that when the Voice Data RF IC 50 implements one or more of its functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

In operation, the voice data RF IC 50 executes operational instructions that implement one or more of the applications (real-time or non-real-time) attributed to communication devices 10 and 30 as discussed in conjunction with FIGS. 1 and 3. Further, RF IC 50 includes an on-chip antenna interface 79 that operates with antenna interface 72 in accordance with the present invention, as will be discussed in greater detail in association with the description that follows, and particularly in conjunction with FIGS. 6-8.

Figure 4:
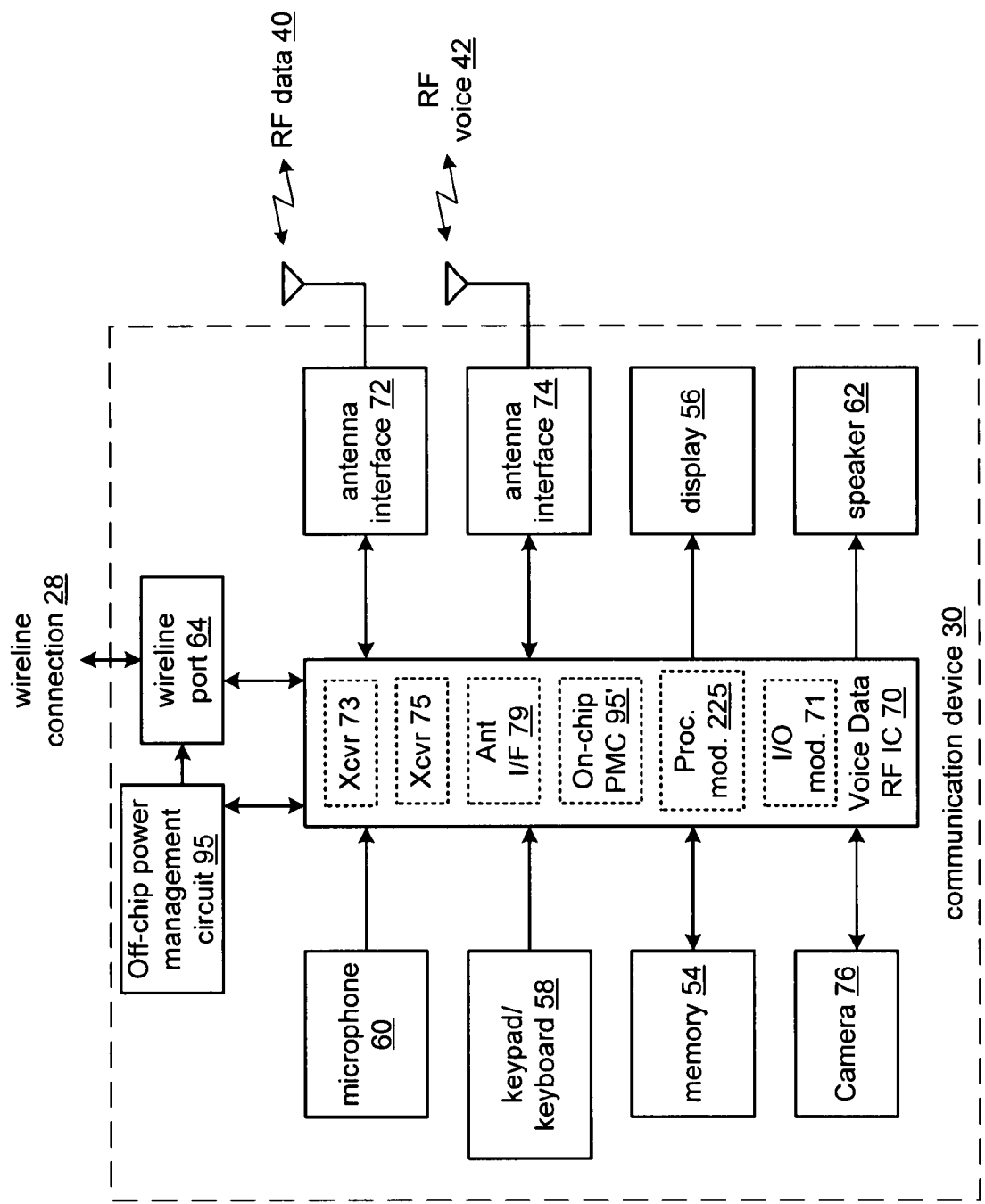
FIG. 4 is a schematic block diagram of a wireless communication device 30 in accordance with the present invention.

FIG. 4 is a schematic block diagram of another embodiment of an integrated circuit in accordance with the present invention. In particular, FIG. 4 presents a communication device 30 that includes many common elements of FIG. 3 that are referred to by common reference numerals. Voice data RF IC 70 is similar to voice data RF IC 50 and is capable of any of the applications, functions and features attributed to voice data RF IC 50 as discussed in conjunction with FIG. 3. However, voice data RF IC 70 includes two separate wireless 73 and 75 for communicating, contemporaneously, via two or more wireless communication protocols via RF data 40 and RF voice signals 42.

In operation, the voice data RF IC 70 executes operational instructions that implement one or more of the applications (real-time or non-real-time) attributed to communication device 10 as discussed in conjunction with FIG. 1. Further, RF IC 70 includes on-chip antenna interface 79 that includes a plurality of adjustable impedances in accordance with the present invention that operate with off-chip antenna interfaces 72 and 74 to form programmable impedance matching networks and/or band pass filters as will be discussed in greater detail in association with the discuss that follows.

Figure 5:
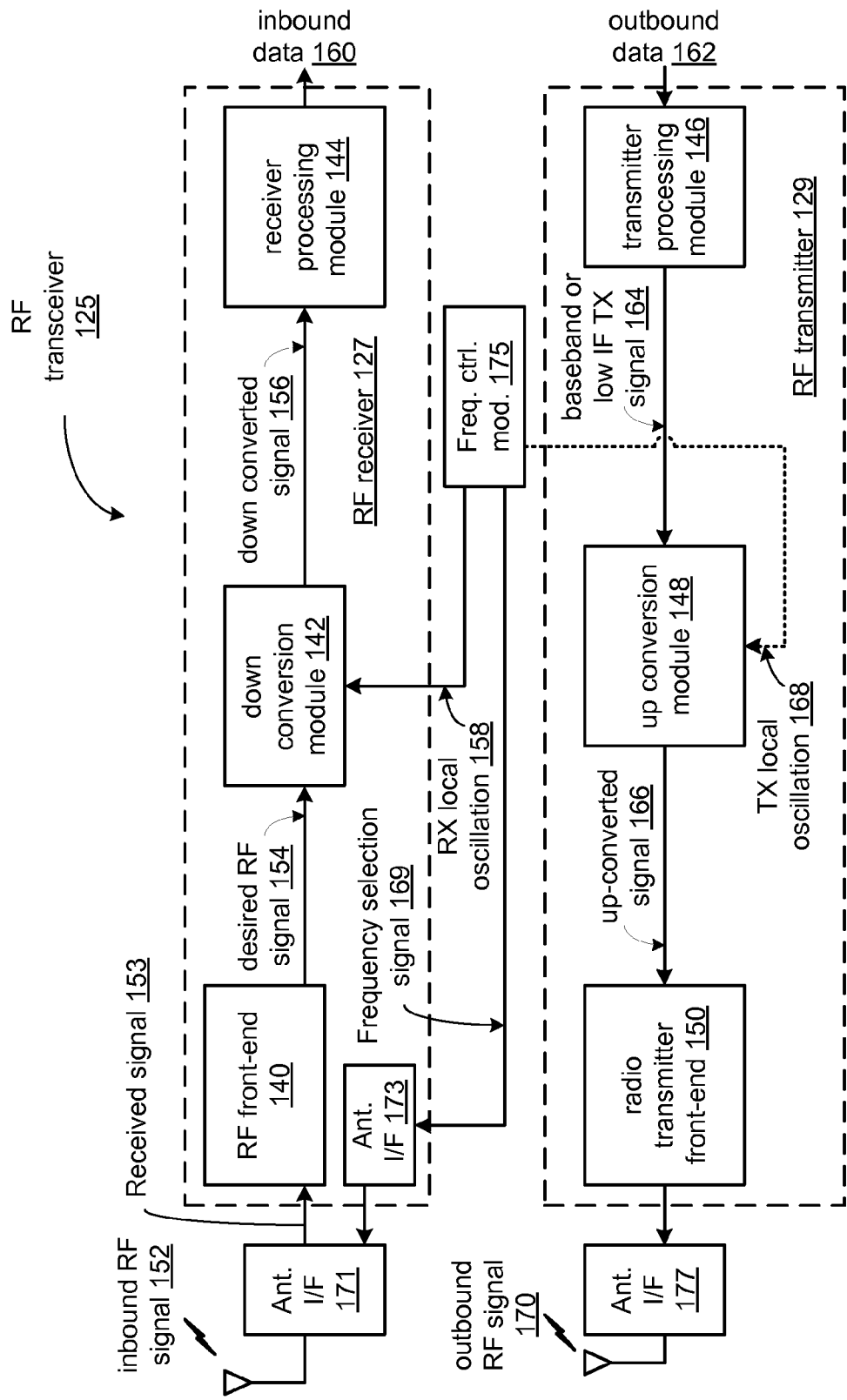
FIG. 5 is a schematic block diagram of an RF transceiver 125 in accordance with the present invention.

FIG. 5 is a schematic block diagram of an RF transceiver 125, such as transceiver 73 or 75, which may be incorporated in communication devices 10 and/or 30. The RF transceiver 125 includes an RF transmitter 129, an RF receiver 127 and a frequency control module 175. The RF receiver 127 includes a RF front end 140, a down conversion module 142, an on-chip antenna interface 173, such as antenna interface 79, and a receiver processing module 144. The RF transmitter 129 includes a transmitter processing module 146, an up conversion module 148, and a radio transmitter front-end 150.

As shown, the receiver and transmitter are each coupled to an antenna thru an off-chip antenna interface (171, 177), however, the receiver and transmitter may share a single antenna via a transmit/receive switch and/or transformer balun. In another embodiment, the receiver and transmitter may share a diversity antenna structure that includes two or more antennas. In another embodiment, the receiver and transmitter may each use its own diversity antenna structure that include two or more antennas. In another embodiment, the receiver and transmitter may share a multiple input multiple output (MIMO) antenna structure that includes a plurality of antennas. Each of these antennas may be fixed, programmable, and antenna array or other antenna configuration. Accordingly, the antenna structure of the wireless transceiver will depend on the particular standard(s) to which the wireless transceiver is compliant and the applications thereof.

In operation, the transmitter receives outbound data 162 from a host device or other source via the transmitter processing module 146. The transmitter processing module 146 processes the outbound data 162 in accordance with a particular wireless communication standard (e.g., IEEE 802.11, Bluetooth, RFID, GSM, CDMA, et cetera) to produce baseband or low intermediate frequency (IF) transmit (TX) signals 164. The baseband or low IF TX signals 164 may be digital baseband signals (e.g., have a zero IF) or digital low IF signals, where the low IF typically will be in a frequency range of one hundred kilohertz to a few megahertz. Note that the processing performed by the transmitter processing module 146 includes, but is not limited to, scrambling, encoding, puncturing, mapping, modulation, and/or digital baseband to IF conversion. Further note that the transmitter processing module 146 may be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 146 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

The up conversion module 148 includes a digital-to-analog conversion (DAC) module, a filtering and/or gain module, and a mixing section. The DAC module converts the baseband or low IF TX signals 164 from the digital domain to the analog domain. The filtering and/or gain module filters and/or adjusts the gain of the analog signals prior to providing it to the mixing section. The mixing section converts the analog baseband or low IF signals into up converted signals 166 based on a transmitter local oscillation 168.

The radio transmitter front end 150 includes a power amplifier 84 and may also include a transmit filter module. The power amplifier amplifies the up converted signals 166 to produce outbound RF signals 170, which may be filtered by the transmitter filter module, if included. The antenna structure transmits the outbound RF signals 170 to a targeted device such as a RF tag, base station, an access point and/or another wireless communication device via an antenna interface 177 coupled to an antenna that provides impedance matching and optional bandpass filtration.

The receiver receives inbound RF signals 152 via the antenna and off-chip antenna interface 171 that operates in conjunction with on-chip antenna interface 173 to process the inbound RF signal 152 into received signal 153 for the receiver front-end 140, as will be described in greater detail with reference to FIGS. 6-8. In general, antenna interfaces 171 and 173 cooperate to provide bandpass filtration of the inbound RF signal 152 and impedance matching of antenna to the RF front-end 140. This interface is programmable based on the frequency selection signal 169 to adapt the passband of the bandpass filter and/or the impedance matching of the antenna interface to the particular carrier frequency or other frequency or frequencies of interest to the RF receiver 127.

The down conversion module 70 includes a mixing section, an analog to digital conversion (ADC) module, and may also include a filtering and/or gain module. The mixing section converts the desired RF signal 154 into a down converted signal 156 that is based on a receiver local oscillation 158, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 156. Note that the ordering of the ADC module and filtering and/or gain module may be switched, such that the filtering and/or gain module is an analog module.

The receiver processing module 144 processes the baseband or low IF signal 156 in accordance with a particular wireless communication standard (e.g., IEEE 802.11, Bluetooth, RFID, GSM, CDMA, et cetera) to produce inbound data 160. The processing performed by the receiver processing module 144 includes, but is not limited to, digital intermediate frequency to baseband conversion, demodulation, demapping, depuncturing, decoding, and/or descrambling.

Note that the receiver processing modules 144 may be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the receiver processing module 144 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Frequency control module 175 controls a frequency of the transmitter local oscillation and a frequency of the receiver local oscillation, in accordance with a desired carrier frequency. In an embodiment of the present invention, frequency control module includes a transmit local oscillator and a receive local oscillator that can operate at a plurality of selected frequencies corresponding to a plurality of carrier frequencies of the outbound RF signal 170. In addition, frequency control module 175 generates a frequency selection signal 169 that indicates the current selection for the carrier frequency. In operation, the carrier frequency can be predetermined or selected under user control. In alternative embodiments, the frequency control module can change frequencies to implement a frequency hopping scheme that selectively controls the carrier frequency to a sequence of carrier frequencies. In a further embodiment, frequency control module 175 can evaluate a plurality of carrier frequencies and select the carrier frequency based on channel characteristics such as a received signal strength indication, signal to noise ratio, signal to interference ratio, bit error rate, retransmission rate, or other performance indicator.

In an embodiment of the present invention, frequency control module 175 includes a processing module that performs various processing steps to implement the functions and features described herein. Such a processing module can be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the frequency control module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Figure 6:
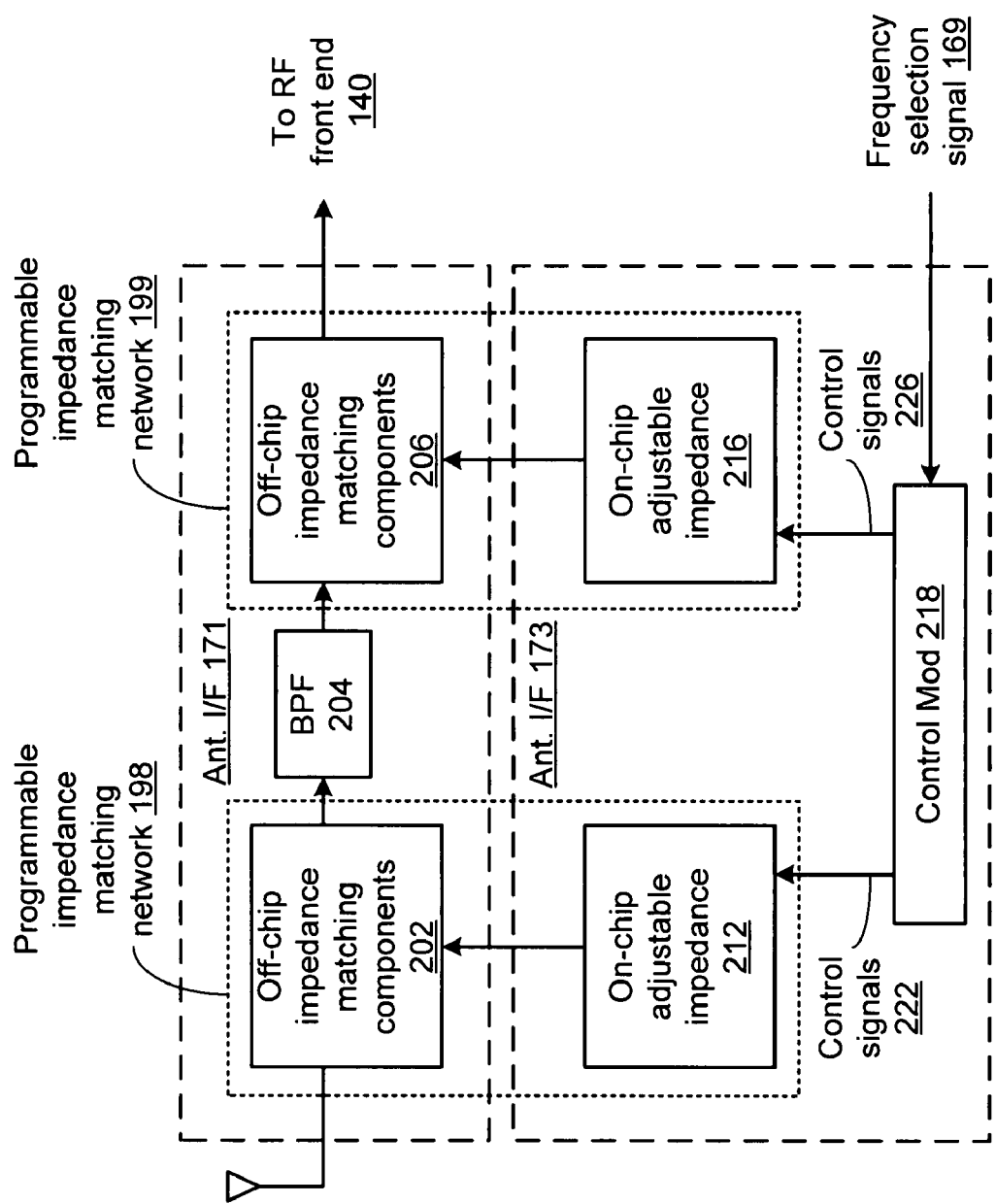
FIG. 6 is a schematic block diagram of an embodiment of antenna interfaces 171 and 173 in accordance with the present invention.

FIG. 6 is a schematic block diagram of an embodiment of antenna interfaces 171 and 173 in accordance with the present invention. In particular, off-chip antenna interface 171 includes one or more first off-chip impedance matching components 202 that are coupleable to an antenna, a bandpass filter, and one or more second off-chip impedance matching components 206. Antenna interface 173, implemented on an integrated circuit, such as voice, data and RF IC 50 or 70 or other integrated circuit that implements RF receiver 129, includes on-chip adjustable impedance 212 that forms programmable impedance matching network 198 with the off-chip impedance matching components 202, and on-chip adjustable impedance 216 forms a second programmable impedance matching network 199 with the off-chip impedance matching components 206. Control module 218 generates control signals 222 and 226 in response to the frequency selection signal to control the on-chip adjustable impedance 212 to a first value and the on-chip adjustable impedance 216 to a second value.

In an embodiment of the present invention, the bandpass filter 204 is implemented with a tank circuit or other filter to provide a passband, such as a passband having a bandwidth that is sufficient to pass some or all of the possible desired frequencies received by the antenna. For instance, considering a GSM application, the bandpass filter may have a 100 MHz bandwidth, however greater or lesser bandwidths can also be used depending on the particular application and design. The bandpass filter and antenna each have an impedance that may vary significantly over this wide range of frequencies. In operation, the programmable impedance matching networks 198 and 199 are programmable based on the frequency selection signal to provide impedance matching for the antenna and bandpass filter to provide improved impedance matching to the RF front end 140.

In particular, the off-chip impedance matching components 202 and 206 of programmable impedance matching networks 198 and 199 can include one or more fixed inductors, transformers, capacitors or other circuit elements that combine with the on-chip adjustable impedances 212 and 216 to form impedance matching networks in a L-network, T-network, pi-network, balun, or other network configuration to provide this impedance matching. The particular impedance values of the on-chip adjustable impedances 212 and 216 are designed to provide the desired total impedance as seen by the RF front end 140 for each selected frequency of frequency selection signal 169. Control module 218, generates control signals 222 and 226 to control the impedances of the on-chip adjustable impedances 212 and 216 to the desired values, based on the frequency selection.

For instance, the RF front end 140 may be designed to couple to an impedance that has a 50 ohm real component and a negligible complex component at each selected frequency. The impedances of the antenna, bandpass filter and the programmable impedance matching networks 198 and 199 are designed to produce a total impedance as seen by the RD front end 140 that equals or substantially equals this desired impedance for each of the selected frequencies. The amount of allowable variation, can be based on the application, the range of desired frequencies, the specification of RF front end 140, the tolerance of the on-chip and off-chip components including the antenna, the variation of these impedances with temperature and other design considerations. It should be noted that greater accuracy can potentially be achieved by using cascaded Pi-networks, T-networks, L-networks and other more complex designs that potentially use a plurality of adjustable impedances in on-chip adjustable impedances 212 and 216 to offer greater degrees of design freedom, at the expense of greater cost and design complexity.

In an embodiment of the present invention, control module 218 includes a processing module that performs various processing steps to implement the functions and features described herein. Such a processing module can be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the control module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In one mode of operation, the set of possible selected frequencies is known in advance and the control module 218 is preprogrammed with the particular control signals 222 and 226 that correspond to each selected frequency, so that when a particular frequency is selected, logic or other circuitry or programming, such as via a look-up table, can be used to retrieve the particular control signals required for that selected frequency. In a further mode of operation, the control module 218, based on equations derived from impedance network principles that will be apparent to one of ordinary skill in the art when presented the disclosure herein, calculates the particular impedances that are required of on-chip adjustable impedances 212 and 216 and generates control signals 222 and 226 to implement these particular impedances.

Figure 7:
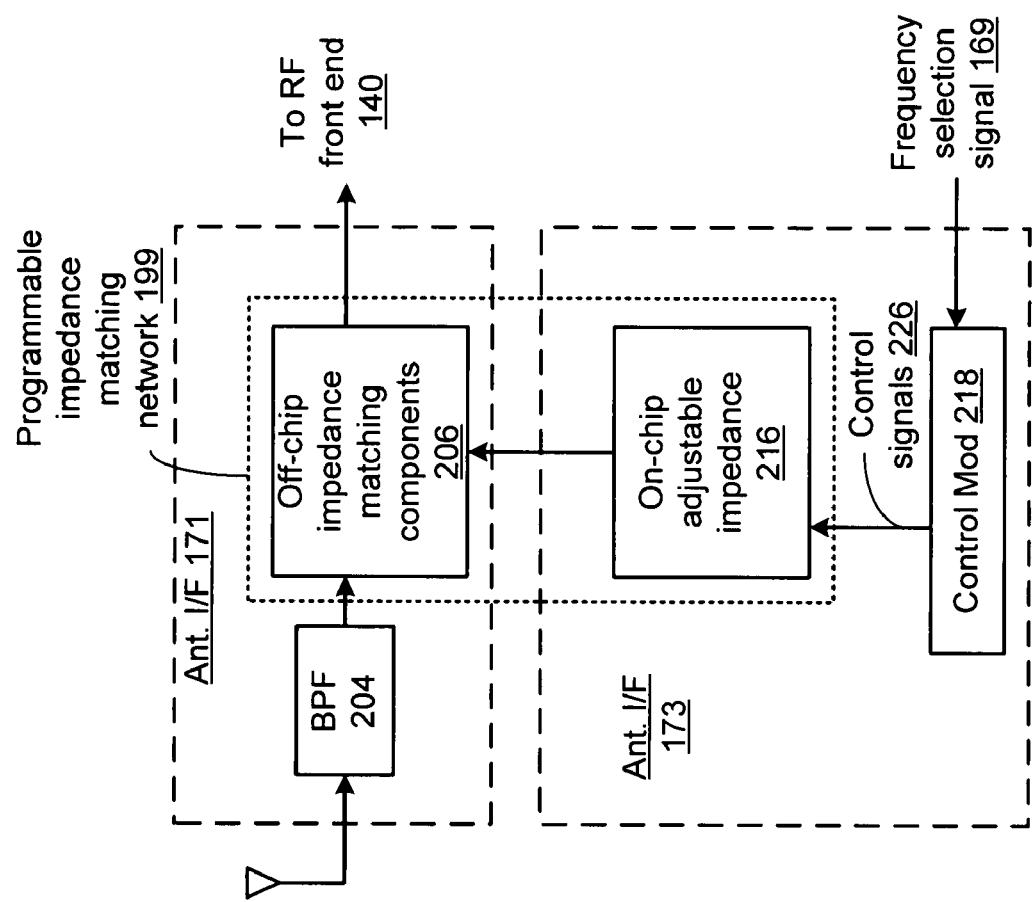
FIG. 7 is a schematic block diagram of a further embodiment of antenna interfaces 171 and 173 in accordance with the present invention.

FIG. 7 is a schematic block diagram of a further embodiment of antenna interfaces 171 and 173 in accordance with the present invention. In this embodiment, antenna interface 171 includes one or more off-chip impedance matching components 206 and bandpass filter 204, and antenna interface 173 includes on-chip adjustable impedance 216 and control module 218. These interfaces operate in a fashion similar to the antenna interfaces described in conjunction with FIG. 6, with similar reference numerals indicating similar components.

In this embodiment however, bandpass filter 204 has a passband that covers less than the full frequency range of desired input frequencies. In particular, the off-chip impedance matching components 206 of programmable impedance matching network 199 can include one or more fixed inductors, transformers, capacitors or other circuit elements that combine with the on-chip adjustable impedances 216 to form an impedance matching network in a L-network, T-network, pi-network, balun, or other network configuration including cascaded network designs to provide impedance matching for the antenna and bandpass filter 204 and also to shift the passband of bandpass filter 204 to encompass the selected frequency and its associated bandwidth. The particular impedance values of the on-chip adjustable impedance 216 are designed to provide the desired total impedance as seen by the RF front end 140 and to pass the desired frequencies for each selected frequency of frequency selection signal 169. Control module 218, generates control signal 226 to control one or more impedances of the on-chip adjustable impedance 216 to the desired value, based on the frequency selection.

For instance, the RF front end 140 may be designed to couple to an impedance that has a 50 ohm real component and a negligible complex component at each selected frequency. The impedances of the antenna, bandpass filter and the programmable impedance matching network 199 are designed to produce a total impedance as seen by the RD front end 140 that equals or substantially equals this desired impedance for each of the selected frequencies. In addition, the bandpass filter may be designed with a 20 Mhz bandwidth and have a pass band with an adjustable center frequency that can be varied over a 100 MHz range of desired GSM input signals. As in the design of FIG. 6, the amount of allowable variation, can be based on the application, the range of desired frequencies, the specification of RF front end 140, the tolerance of the on-chip and off-chip components including the antenna, the variation of these impedances with temperature, and other design considerations.

Figure 8:
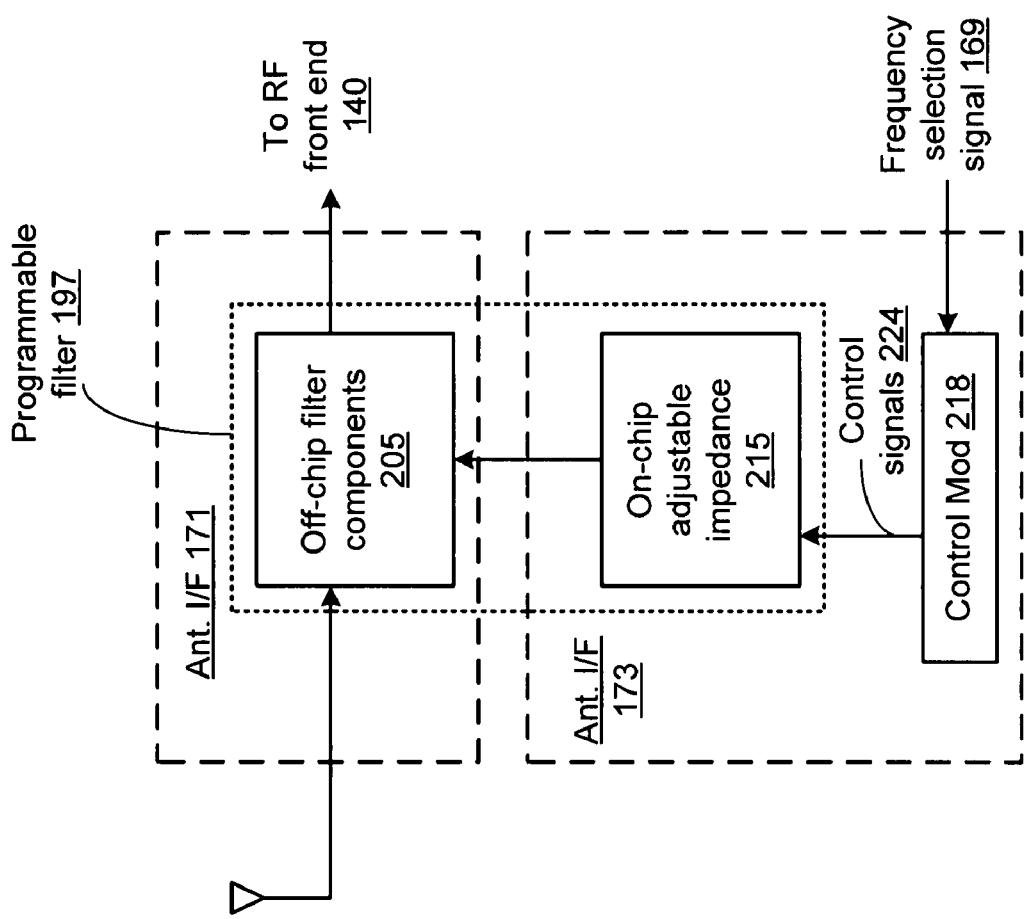
FIG. 8 is a schematic block diagram of a further embodiment of antenna interfaces 171 and 173 in accordance with the present invention.

FIG. 8 is a schematic block diagram of a further embodiment of antenna interfaces 171 and 173 in accordance with the present invention. In this embodiment, antenna interface 171 includes off-chip bandpass filter components 205 and antenna interface 173 includes on-chip adjustable impedance 215 and control module 218. In this embodiment however, off-chip filter components 205 and on-chip adjustable impedance 215 combine to form programmable filter 197 that performs both filtration and impedance matching for each of the selected frequencies. This filtration can be bandpass, notch, lowpass, highpass or other filtration that filters one or more undesired frequencies while passing, or substantially passing one or more desired frequencies.

In particular, the off-chip filter components 205 of programmable impedance matching network 199 can include one or more fixed inductors, transformers, capacitors, crystals or other circuit elements that combine with the on-chip adjustable impedances 216 to form an impedance matching network in one or more tank circuit, L-network, T-network, pi-network, balun, or other network configuration including cascaded network designs to provide impedance matching for the antenna and programmable filter 197 and also either shift the passband of programmable filter 197 to encompass the selected frequency and its associated bandwidth or to provide sufficient bandwidth for all selected frequencies and their associated bandwidth and optionally to adjust other filter parameters such as peak gain, quality, bandwidth, etc. The particular impedance values of the on-chip adjustable impedance 215 are designed to provide the desired total impedance as seen by the RF front end 140 and to pass the desired frequencies for each selected frequency of frequency selection signal 169. Control module 218, generates control signal 224 to control the one or more impedances of the on-chip adjustable impedance 215 to the desired value, based on the frequency selection.

For instance, control module 218 produces control signals 224 to command the on-chip adjustable impedance 215 to modify its impedance to conform with a particular carrier frequency that is indicated by the frequency selection signal 169. In the event that frequency selection signal indicates a particular carrier frequency corresponding to a particular 802.11 channel of the 2.4 GHz band, the control module 218 generates control signals 224 that command the on-chip adjustable impedance 215 to adjust its impedance such that the overall resonant frequency of the programmable filter, is equal to, substantially equal to or as close as possible to the selected carrier frequency, and the impedance seen by the RF front end 140 including both the antenna and the programmable filter 197 is equal to, substantially equal to or as close as possible to the designed impedance.

While the foregoing discussion has focused on the use of bifurcated impedance matching networks and filters, such as bandpass filters or other filters with portions implemented with fixed off-chip components and portions implemented with adjustable on-chip components, implemented in conjunction with an RF receiver, these components can likewise be implemented in a the transmitter portion of a transceiver, such as RF transmitter 129 by replacing the antenna interface 177 with on-chip and off-chip antenna interfaces similar to antenna interfaces 171 and 173.

Figure 9:
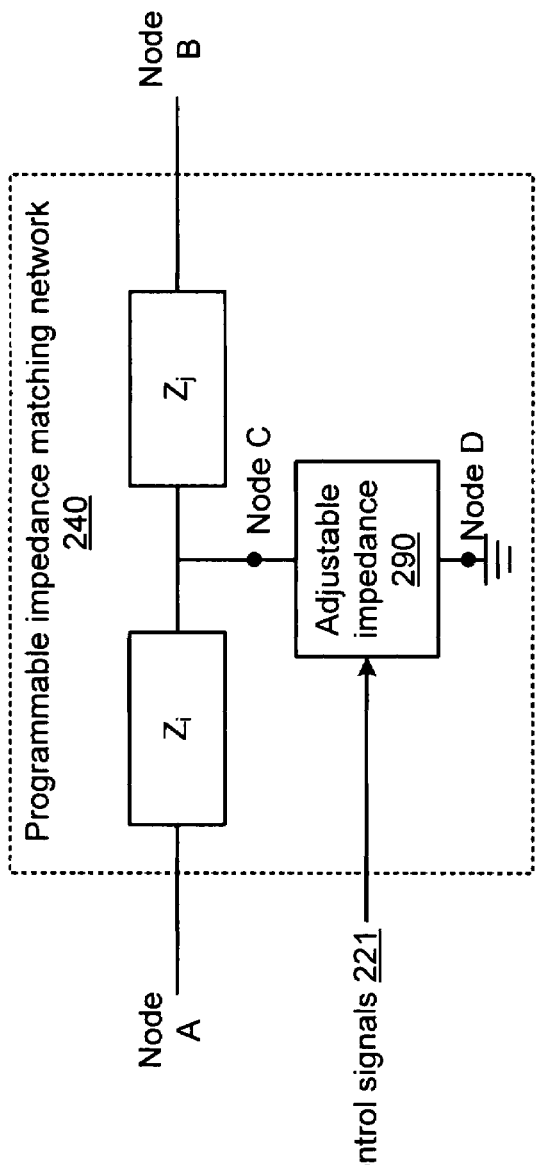
FIG. 9 is a schematic block diagram of an embodiment of a programmable impedance matching network 240 in accordance with the present invention.

FIG. 9 is a schematic block diagram of an embodiment of a programmable impedance matching network 240 in accordance with the present invention. In particular, a programmable impedance matching network 240, such as programmable impedance matching network 198 or 199, includes two off-chip impedance matching components, represented by impedances $Z_i$ and $Z_j$, and an adjustable impedance 290 that responds to control signal 221, such as control signals 222, 224, 226, that are connected in a T-network configuration. Each of the impedances $Z_i$ and $Z_j$ can be implemented with a single or multiple off-chip impedance matching components. In an embodiment of the present invention, node A is coupled to either an antenna, the bandpass filter or the receiver, with node B have a connection to one of the two remaining elements.

Figure 10:
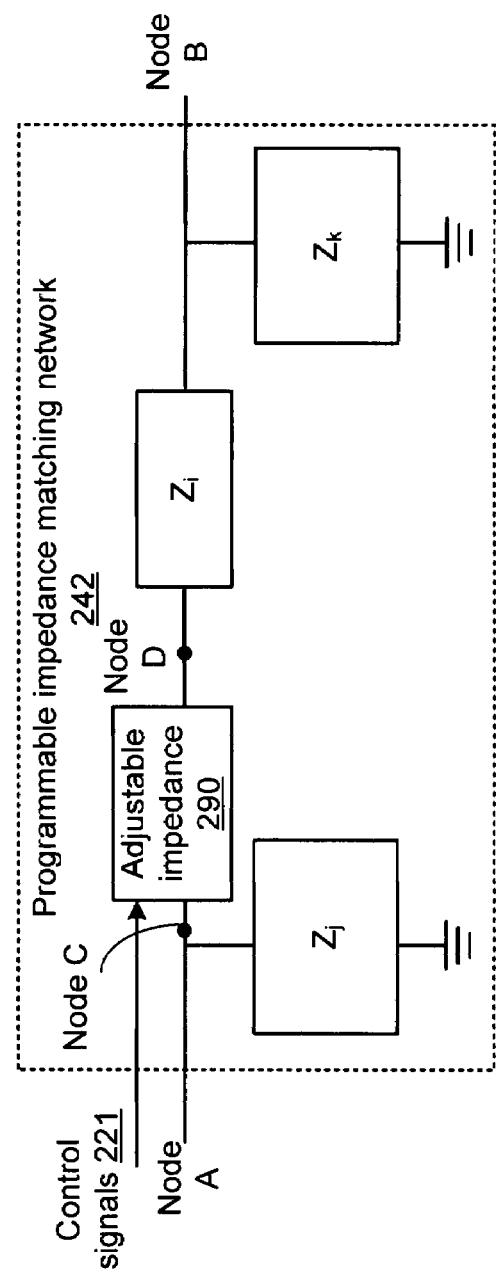
FIG. 10 is a schematic block diagram of an embodiment of a programmable impedance matching network 242 in accordance with the present invention.

FIG. 10 is a schematic block diagram of an embodiment of a programmable impedance matching network 242 in accordance with the present invention. In particular, a programmable impedance matching network 242, such as programmable impedance matching network 198 or 199, includes three off-chip impedance matching components, represented by impedances $Z_i$, $Z_j$ and $Z_k$, and an adjustable impedance 290 that responds to control signal 221, such as control signals 222, 224, 226, that are connected in a pi-network configuration. Each of the impedances $Z_i$, $Z_j$ and $Z_k$ can be implemented with a single or multiple off-chip impedance matching components. In an embodiment of the present invention, node A is coupled to either an antenna, the bandpass filter or the receiver, with node B have a connection to one of the two remaining elements.

It should be noted that programmable impedance matching networks 240 and 242 demonstrate only two examples of many possible configurations within the broad scope of the present invention. It should be noted that, while each design includes only one adjustable impedance 290, likewise, multiple adjustable impedances may be implemented and be separately adjustable by additional control signals from control module 218. It should also be noted that these adjustable impedances may be implemented with one node coupled to a reference node such as ground, as shown in FIG. 9, or with both nodes coupled to the off-chip impedance matching components, as shown in FIG. 10.

Figure 11:
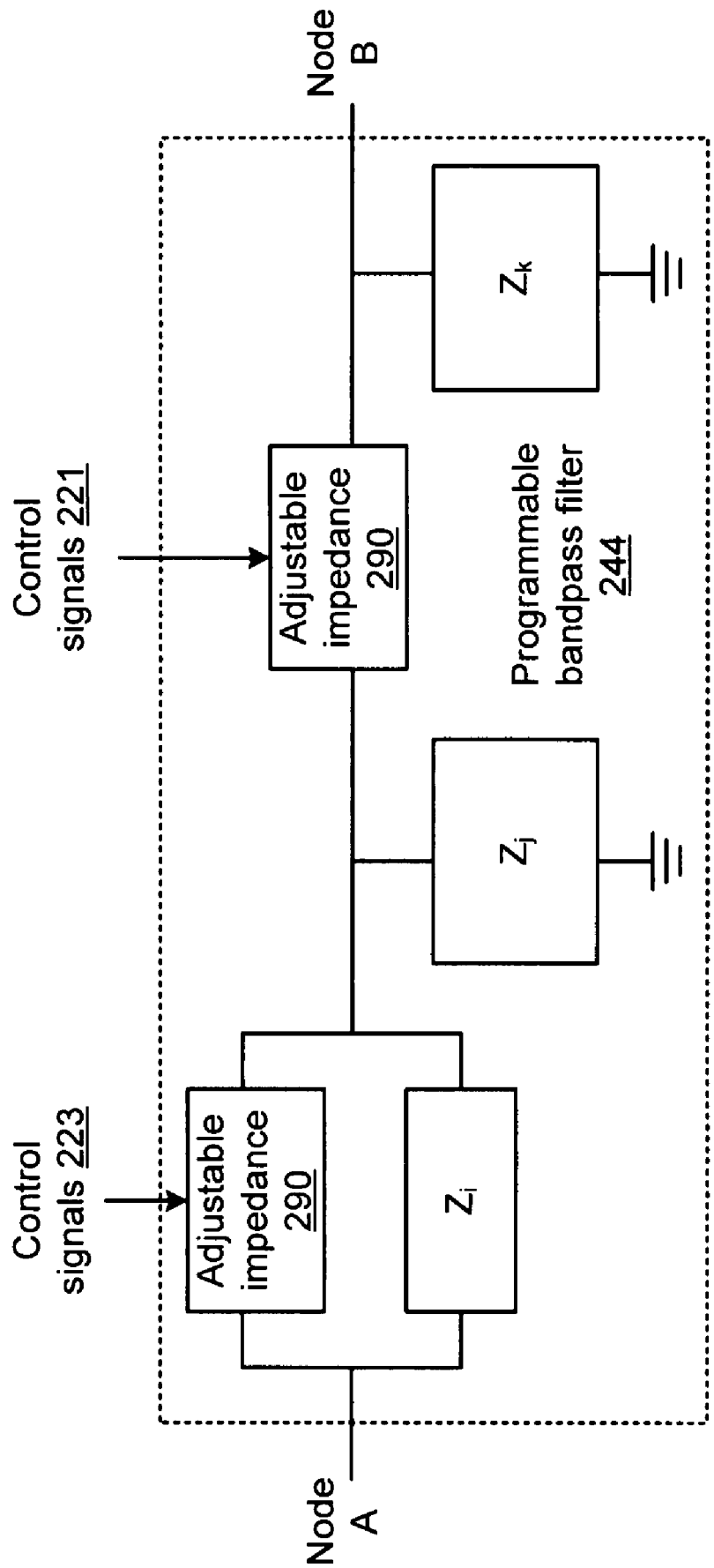
FIG. 11 is a schematic block diagram of an embodiment of a programmable bandpass filter 244 in accordance with the present invention.

FIG. 11 is a schematic block diagram of an embodiment of a programmable bandpass filter 244 in accordance with the present invention. In particular, a programmable bandpass filter 244, such as programmable filter 197, includes three off-chip impedance matching components, represented by impedances $Z_i$, $Z_j$ and $Z_k$, and two adjustable impedances 290 that responds to control signals 221 and 223, such as control signals 222, 224, 226. Each of the impedances $Z_i$, $Z_j$ and $Z_k$ can be implemented with a single or multiple off-chip impedance matching components. In an embodiment of the present invention, node A is coupled to either an antenna or the receiver, with node B have a connection to one remaining element.

It should be noted that programmable bandpass filter 244 demonstrates only one example of many possible configurations within the broad scope of the present invention. It should be noted that, while each design includes two adjustable impedances 290, likewise, only one or three or more adjustable impedances may be implemented and be separately adjustable by control signals from control module 218. It should also be noted that these adjustable impedances may be implemented with one node coupled to a reference node such as ground, or with both nodes coupled to the off-chip impedance matching components, as shown in FIG. 11.

Figure 12:
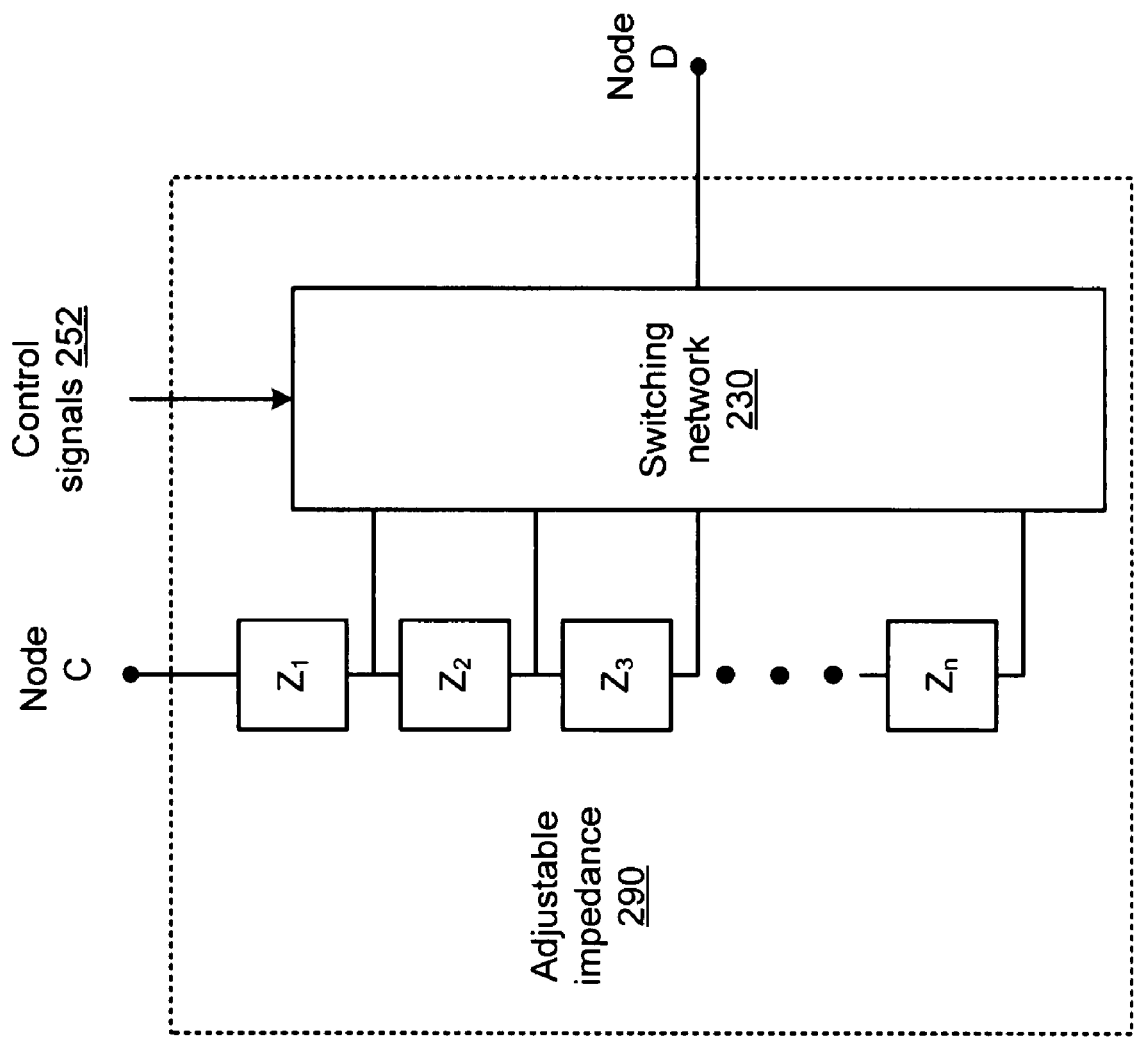
FIG. 12 is a schematic block diagram of an embodiment of an adjustable impedance 290 in accordance with the present invention.

FIG. 12 is a schematic block diagram of an embodiment of an adjustable impedance in accordance with the present invention. An adjustable impedance 290 is shown that includes a plurality of fixed network elements $Z_1$, $Z_2$, $Z_3$, ... $Z_n$ such as resistors, or reactive network elements such as capacitors, and/or inductors. A switching network 230 selectively couples the plurality of fixed network elements in response to one or more control signals 252, such as control signals 221 and/or 223. In operation, the switching network 230 selects at least one of the plurality of fixed reactive network elements and that deselects the remaining ones of the plurality of fixed reactive network elements in response to the control signals 252. In particular, switching network 230 operates to couple one of the plurality of taps to terminal B. In this fashion, the impedance between terminals A and B is adjustable to include a total impedance $Z_1$, $Z_1+Z_2$, $Z_1+Z_2+Z_3$, etc, based on the tap selected. Choosing the fixed network elements $Z_1$, $Z_2$, $Z_3$, ... $Z_n$ to be a plurality of inductors, allows the adjustable impedance 220 to implement an adjustable inductor having a range from ($Z_1$ to $Z_1+Z_2+Z_3+ \ldots +Z_n$). Similarly, choosing the fixed network elements $Z_1$, $Z_2$, $Z_3$, ... $Z_n$ to be a plurality of capacitors, allows the adjustable impedance 220 to implement an adjustable capacitor, etc.

Figure 13:
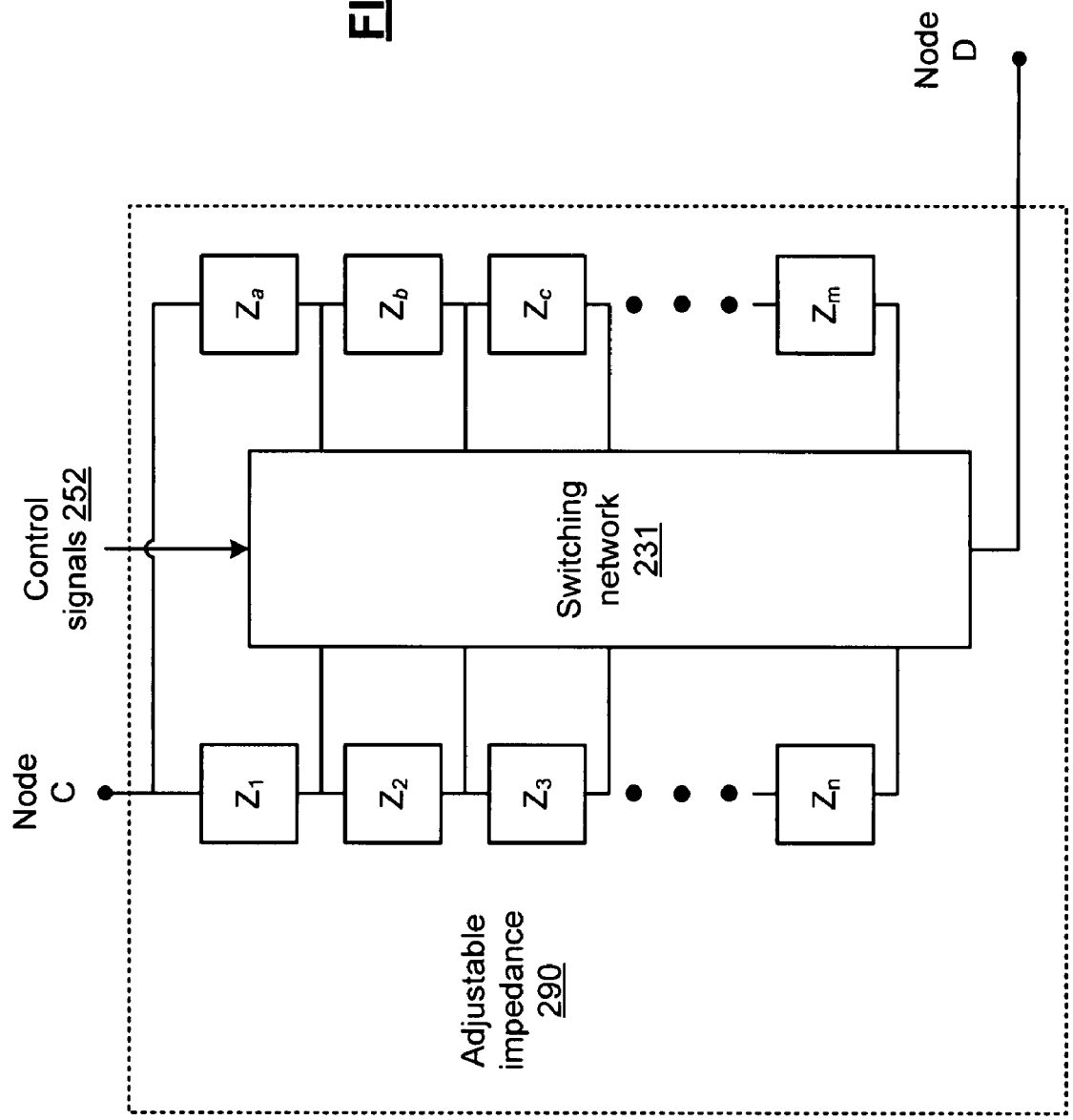
FIG. 13 is a schematic block diagram of a further embodiment of an adjustable impedance 290 in accordance with the present invention.

FIG. 13 is a schematic block diagram of an embodiment of an adjustable impedance in accordance with the present invention. An adjustable impedance 290 is shown that includes a plurality of group A fixed network elements $Z_1$, $Z_2$, $Z_3$, ... $Z_n$ and group B fixed network elements $Z_a$, $Z_b$, $Z_c$, ... $Z_m$ such as resistors, or reactive network elements such as capacitors, and/or inductors. A switching network 231 selectively couples the plurality of fixed network elements in response to one or more control signals 252, such as control signals 221 and/or 223 to form a parallel combination of two adjustable impedances. In operation, the switching network 231 selects at least one of the plurality of fixed reactive network elements and that deselects the remaining ones of the plurality of fixed reactive network elements in response to the control signals 252. In particular, switching network 231 operates to couple one of the plurality of taps from the group A impedances to one of the plurality of taps of the group B impedances to the terminal B. In this fashion, the impedance between terminals A and B is adjustable and can be to form a parallel circuit such as parallel tank circuit having a total impedance equal to the parallel combination between a group A impedance $Z_A=Z_1$, $Z_1+Z_2$, or $Z_1+Z_2+Z_3$, etc, and a Group B impedance $Z_B=Z_a$, $Z_a+Z_b$, or $Z_a+Z_b+Z_c$, etc., based on the taps selected.

Figure 14:
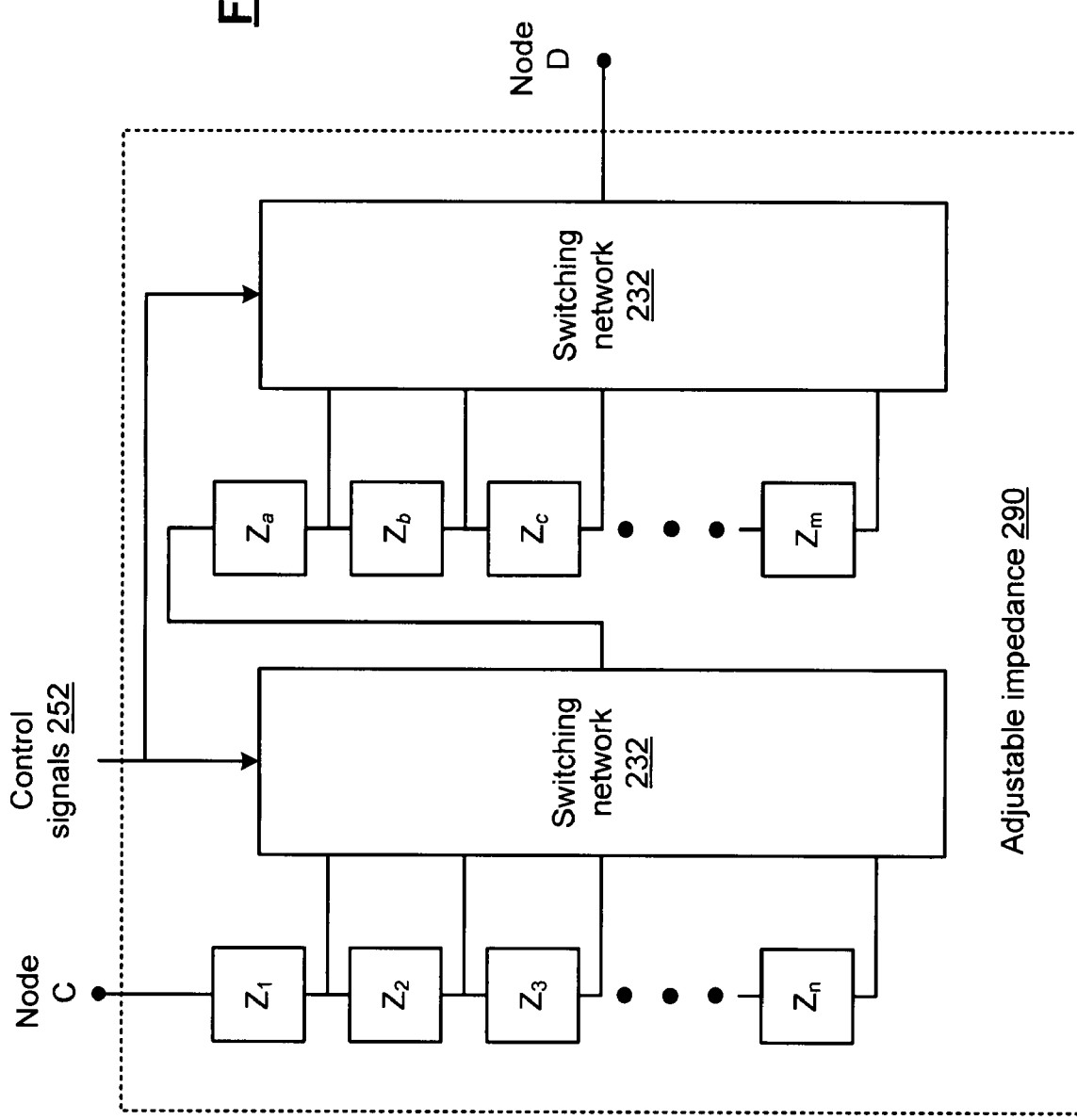
FIG. 14 is a schematic block diagram of a further embodiment of an adjustable impedance 290 in accordance with the present invention.

FIG. 14 is a schematic block diagram of an embodiment of an adjustable impedance in accordance with the present invention. An adjustable impedance 290 is shown that includes a plurality of group A fixed network elements $Z_1$, $Z_2$, $Z_3$, ... $Z_n$ and group B fixed network elements $Z_a$, $Z_b$, $Z_c$, ... $Z_m$ such as resistors, or reactive network elements such as capacitors, and/or inductors. A switching network 232 selectively couples the plurality of fixed network elements in response to one or more control signals 252, such as control signals 221 and/or 223 to form a series combination of two adjustable impedances. In operation, the switching network 232 selects at least one of the plurality of fixed reactive network elements and that deselects the remaining ones of the plurality of fixed reactive network elements in response to the control signals 252. In particular, switching network 232 operates to couple one of the plurality of taps from the group A impedances to the group B impedances and one of the plurality of taps of the group B impedances to the terminal B. In this fashion, the impedance between terminals A and B is adjustable and can be to form a series circuit such as series tank circuit having a total impedance equal to the series combination between a group A impedance $Z_A=Z_1$, $Z_1+Z_2$, or $Z_1+Z_2+Z_3$, etc, and a Group B impedance $Z_B=Z_a$, $Z_a+Z_b$, or $Z_a+Z_b+Z_c$, etc., based on the taps selected.

Figure 15:
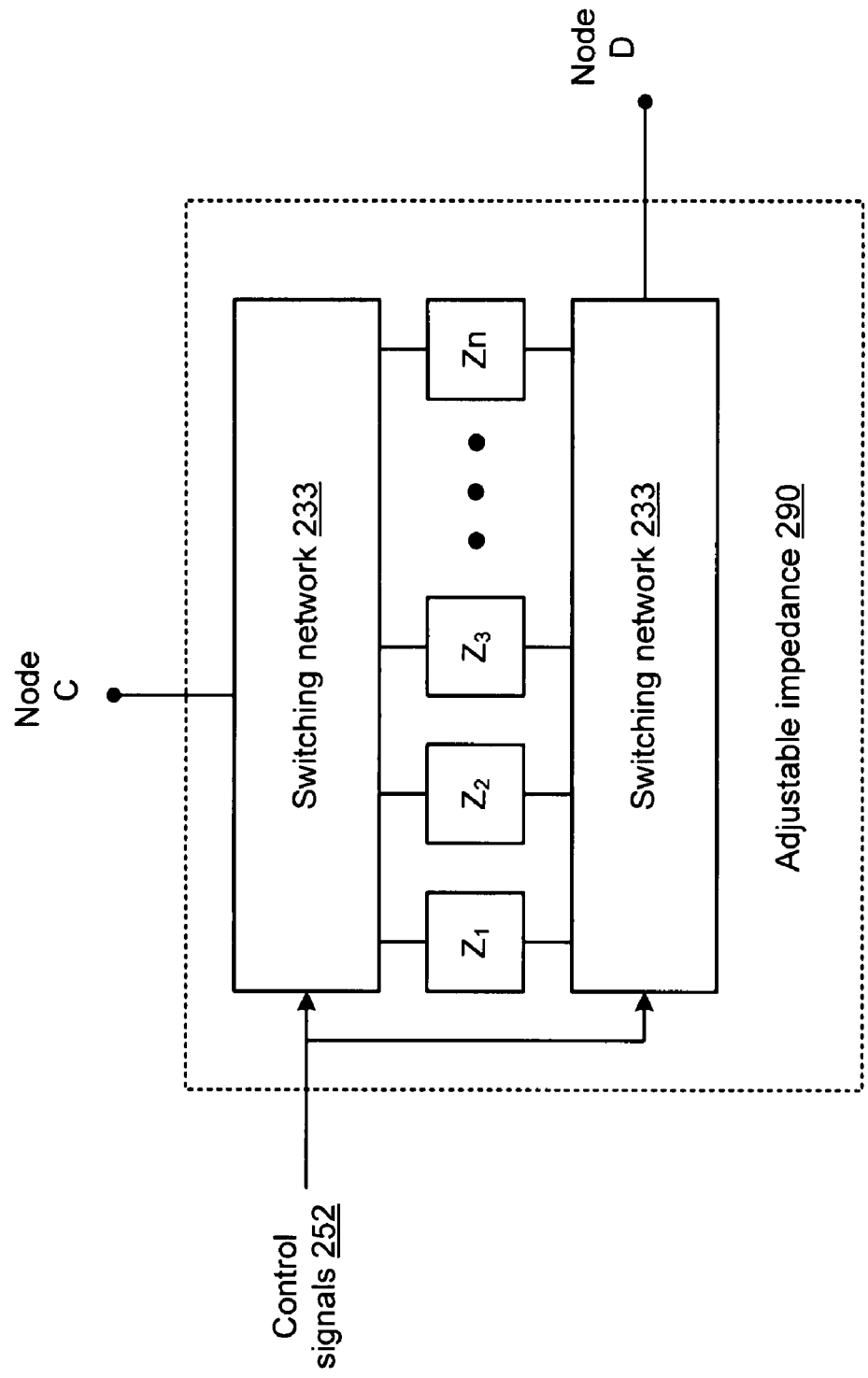
FIG. 15 is a schematic block diagram of a further embodiment of an adjustable impedance 290 in accordance with the present invention.

FIG. 15 is a schematic block diagram of an embodiment of an adjustable impedance in accordance with the present invention. An adjustable impedance 290 is shown that includes a plurality of fixed network elements $Z_1$, $Z_2$, $Z_3$, ... $Z_n$ such as resistors, or reactive network elements such as capacitors, and/or inductors. A switching network 233 selectively couples the plurality of fixed network elements in response to one or more control signals 252, such as control signals 221 and/or 223. In operation, the switching network 233 selects at least one of the plurality of fixed reactive network elements and that deselects the remaining ones of the plurality of fixed reactive network elements in response to the control signals 252. In particular, switching network 233 operates to couple one of the plurality of taps of the top legs of the selected elements to terminal A and the corresponding bottom legs of the selected elements to terminal B. In this fashion, the impedance between terminals A and B is adjustable to include a total impedance that is the parallel combination of the selected fixed impedances. Choosing the fixed network elements $Z_1$, $Z_2$, $Z_3$, ... $Z_n$ to be a plurality of inductances, allows the adjustable impedance 220 to implement an adjustable inductor, from the range from the parallel combination of ($Z_1$, $Z_2$, $Z_3$, ... $Z_n$) to MAX($Z_1$, $Z_2$, $Z_3$ ... $Z_n$). Also, the fixed network elements $Z_1$, $Z_2$, $Z_3$, ... $Z_n$ can be chosen as a plurality of capacitances.

Figure 16:
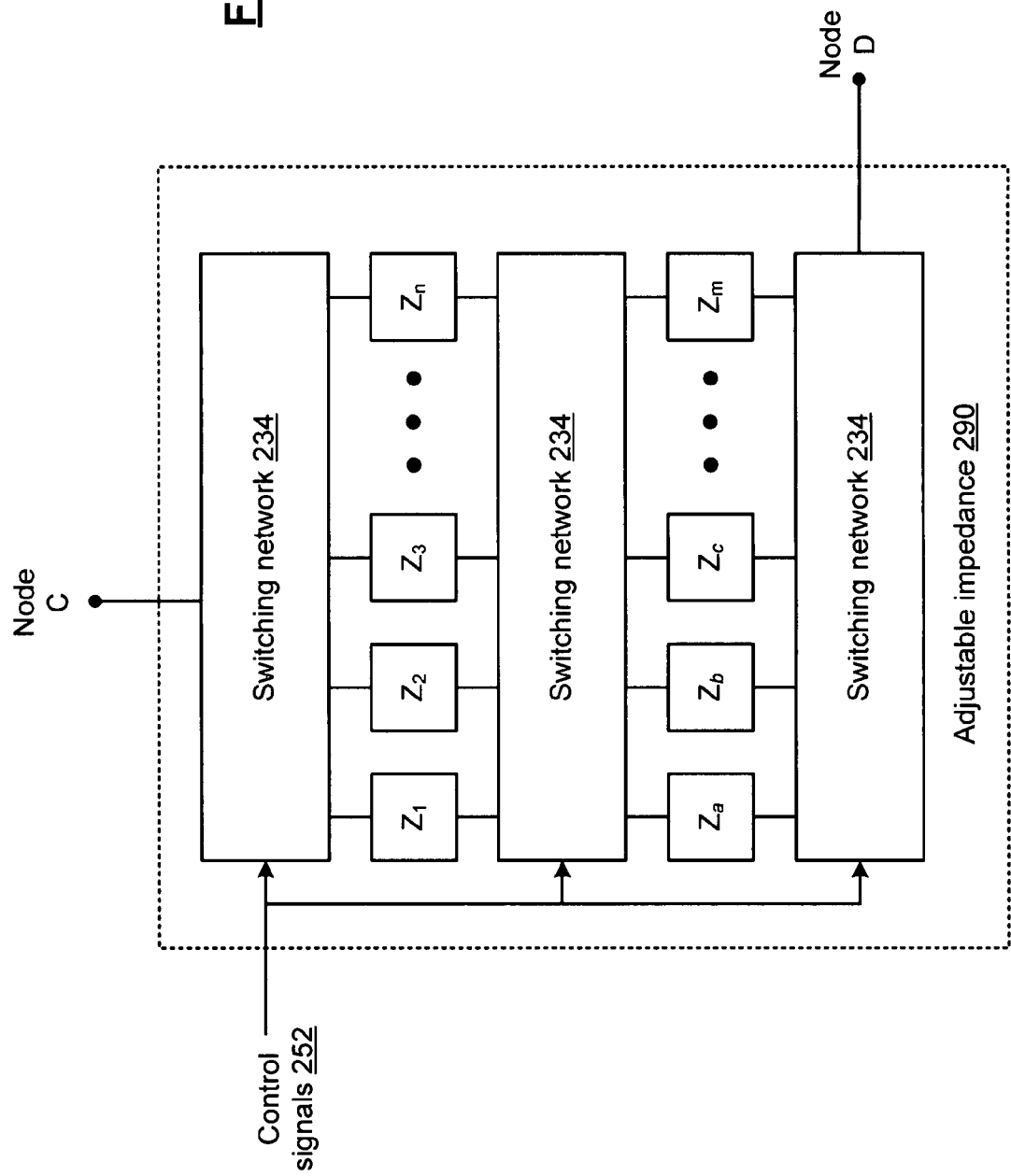
FIG. 16 is a schematic block diagram of a further embodiment of an adjustable impedance 290 in accordance with the present invention.

FIG. 16 is a schematic block diagram of an embodiment of an adjustable impedance in accordance with the present invention. An adjustable impedance 290 is shown that includes a plurality of group A fixed network elements $Z_1$, $Z_2$, $Z_3$, ... $Z_n$ and group B fixed network elements $Z_a$, $Z_b$, $Z_c$, ... $Z_m$ such as resistors, or reactive network elements such as capacitors, and/or inductors. A switching network 234 selectively couples the plurality of fixed network elements in response to one or more control signals 252, such as control signals 221 and/or 223 to form a series combination of two adjustable impedances. In operation, the switching network 234 selects at least one of the plurality of fixed reactive network elements and that deselects the remaining ones of the plurality of fixed reactive network elements in response to the control signals 252. In particular, switching network 232 operates to couple a selected parallel combination of impedances from the group A in series with a selected parallel combination of group B impedances. In this fashion, the impedance between terminals A and B is adjustable and can be to form a series circuit such as series tank circuit having a total impedance equal to the series combination between a group A impedance $Z_A$ and a Group B impedance $Z_B$, based on the taps selected.

Figure 17:
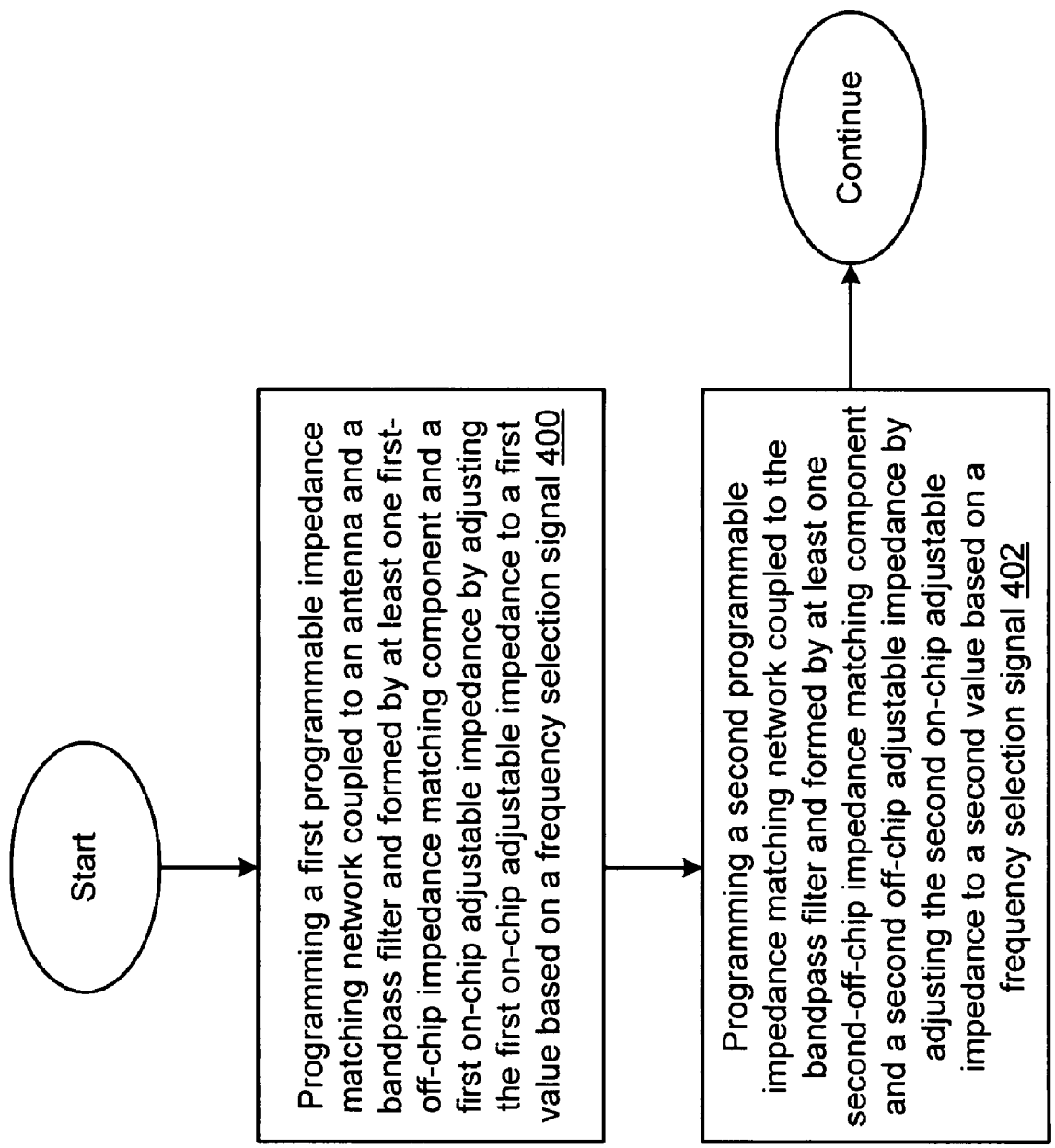
FIG. 17 is a flowchart representation of a method in accordance with an embodiment of the present invention.

FIG. 17 is a flowchart representation of a method in accordance with an embodiment of the present invention. In particular a method is presented for use with one or more features or functions presented in conjunction with FIGS. 1-16. In step 400, a first programmable impedance matching network, coupled to an antenna and a bandpass filter, formed by at least one first off-chip impedance matching component and a first on-chip adjustable impedance, is programmed by adjusting a first impedance of the first on-chip adjustable impedance based on a frequency selection signal. In step 402, a second programmable impedance matching network, coupled to the bandpass filter, formed by at least one second off-chip impedance matching component and a second on-chip adjustable impedance, is programmed by adjusting a second impedance of the second on-chip adjustable impedance based on the frequency selection signal.

In an embodiment of the present invention, step 400 includes generating a first control signal in response to the frequency selection signal to control the first value. Further step 402 can include generating a second control signal in response to the frequency selection signal to control the second value.

Figure 18:
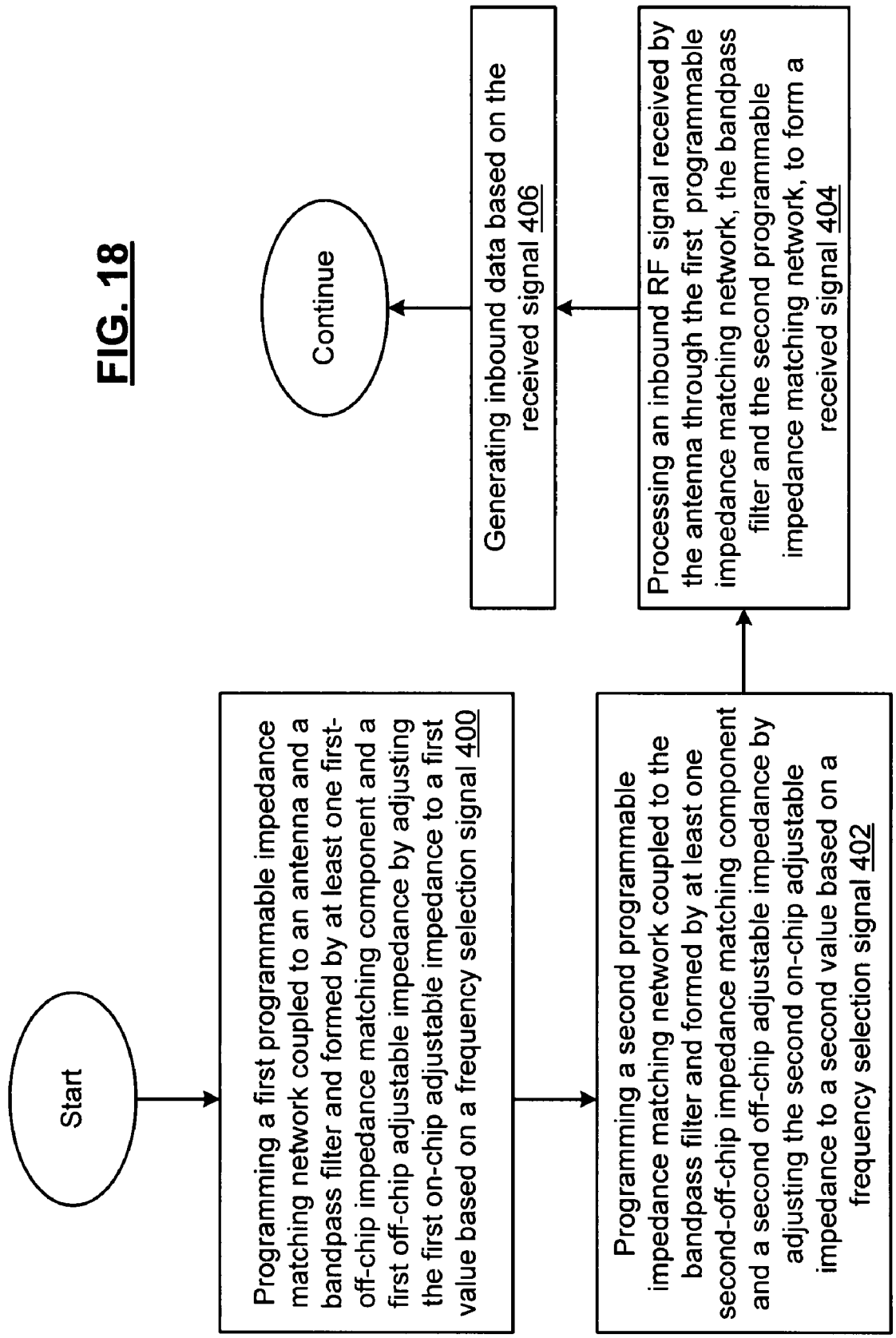
FIG. 18 is a flowchart representation of a method in accordance with an embodiment of the present invention.

FIG. 18 is a flowchart representation of a method in accordance with an embodiment of the present invention. In particular, a method is presented for use with one or more features or function discussed in conjunction with FIGS. 1-16, and that includes elements from FIG. 17 that are referred to by common reference numerals. In addition, the method includes step 404 of processing an inbound RF signal received by the antenna through the first programmable impedance matching network, the band pass filter and the second programmable impedance matching network, to form a received signal. In step 406, inbound data is generated in response to the received signal.

In an embodiment of the present invention, step 406 includes demodulating the received signal at a selected one of a plurality of carrier frequencies in response to the frequency selection signal.

Figure 19:
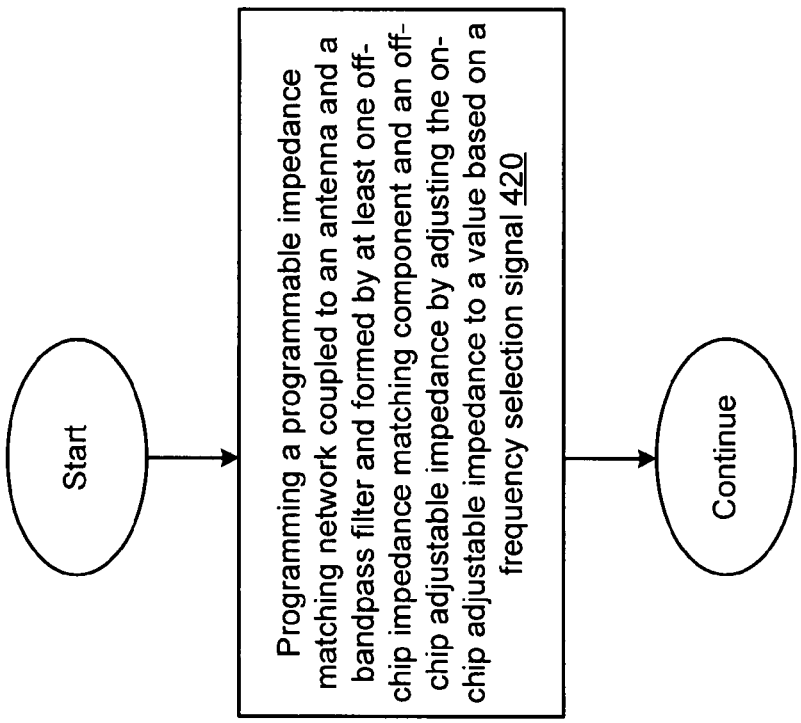
FIG. 19 is a flowchart representation of a method in accordance with an embodiment of the present invention.

FIG. 19 is a flowchart representation of a method in accordance with an embodiment of the present invention. In particular a method is presented for use with one or more features or functions presented in conjunction with FIGS. 1-16. In step 420, a programmable impedance matching network, coupled to an antenna and a bandpass filter, formed by at least one off-chip impedance matching component and an on-chip adjustable impedance, is programmed by adjusting the on-chip adjustable impedance to a first value based on a frequency selection signal.

In an embodiment of the present invention, step 420 include generating a control signal in response to the frequency selection signal to control the on-chip adjustable impedance to the first value.

Figure 20:
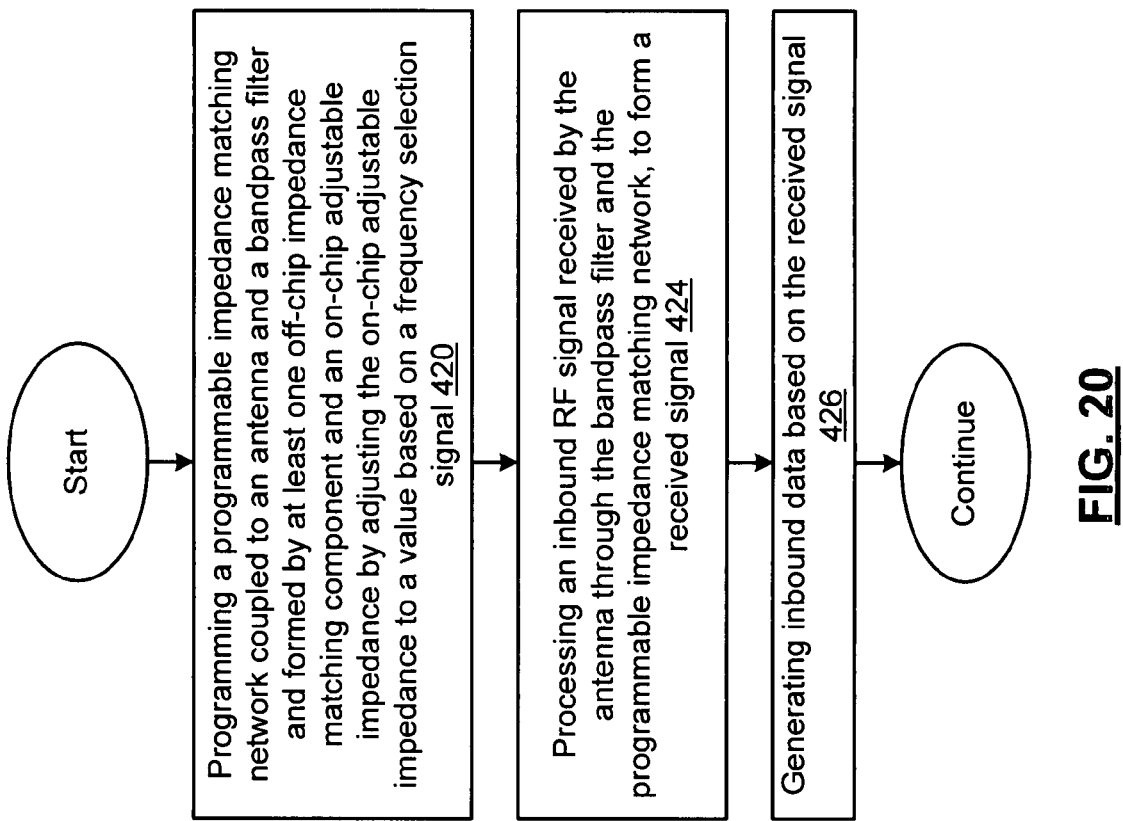
FIG. 20 is a flowchart representation of a method in accordance with an embodiment of the present invention.

FIG. 20 is a flowchart representation of a method in accordance with an embodiment of the present invention. In particular, a method is presented for use with one or more features or function discussed in conjunction with FIGS. 1-16, and that includes elements from FIG. 19 that are referred to by common reference numerals. In addition, the method includes step 424 of processing an inbound RF signal received by the antenna through the band pass filter and the programmable impedance matching network, to form a received signal. In step 426, inbound data is generated in response to the received signal.

In an embodiment of the present invention, step 426 includes demodulating the received signal at a selected one of a plurality of carrier frequencies in response to the frequency selection signal.

Figure 21:
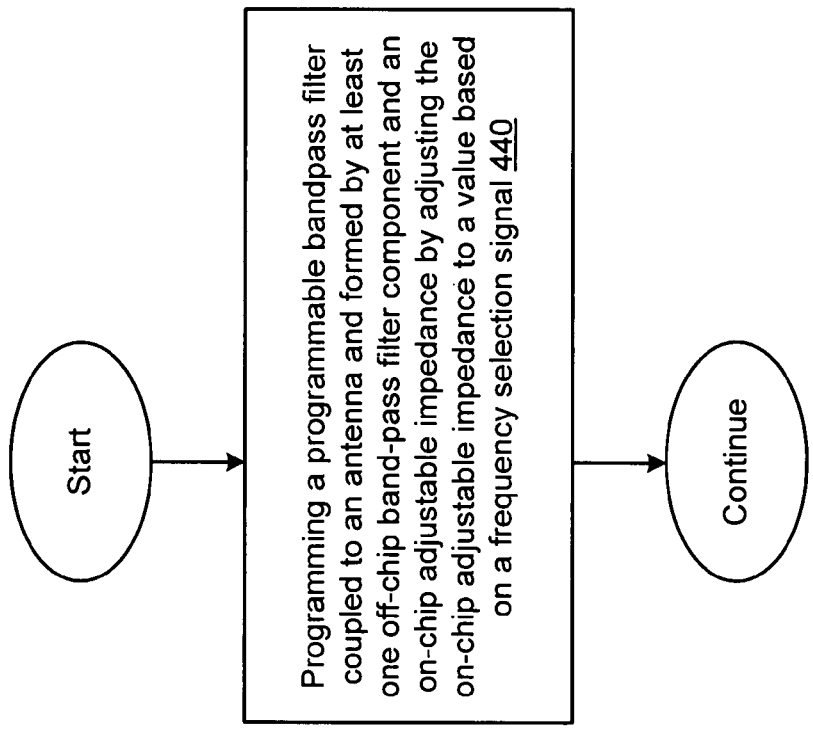
FIG. 21 is a flowchart representation of a method in accordance with an embodiment of the present invention.

FIG. 21 is a flowchart representation of a method in accordance with an embodiment of the present invention. In particular a method is presented for use with one or more features or functions presented in conjunction with FIGS. 1-16. In step 440, a programmable bandpass filter, formed by at least one off-chip bandpass filter component and an on-chip adjustable impedance, is programmed by adjusting the on-chip adjustable impedance to a first value based on a frequency selection signal.

In an embodiment of the present invention, step 440 includes generating a control signal in response to the frequency selection signal to control the on-chip adjustable impedance to the first value. Further, step 440 can include adjusting a pass band, peak gain and/or a total impedance of the programmable bandpass filter based on the frequency selection signal.

Figure 22:
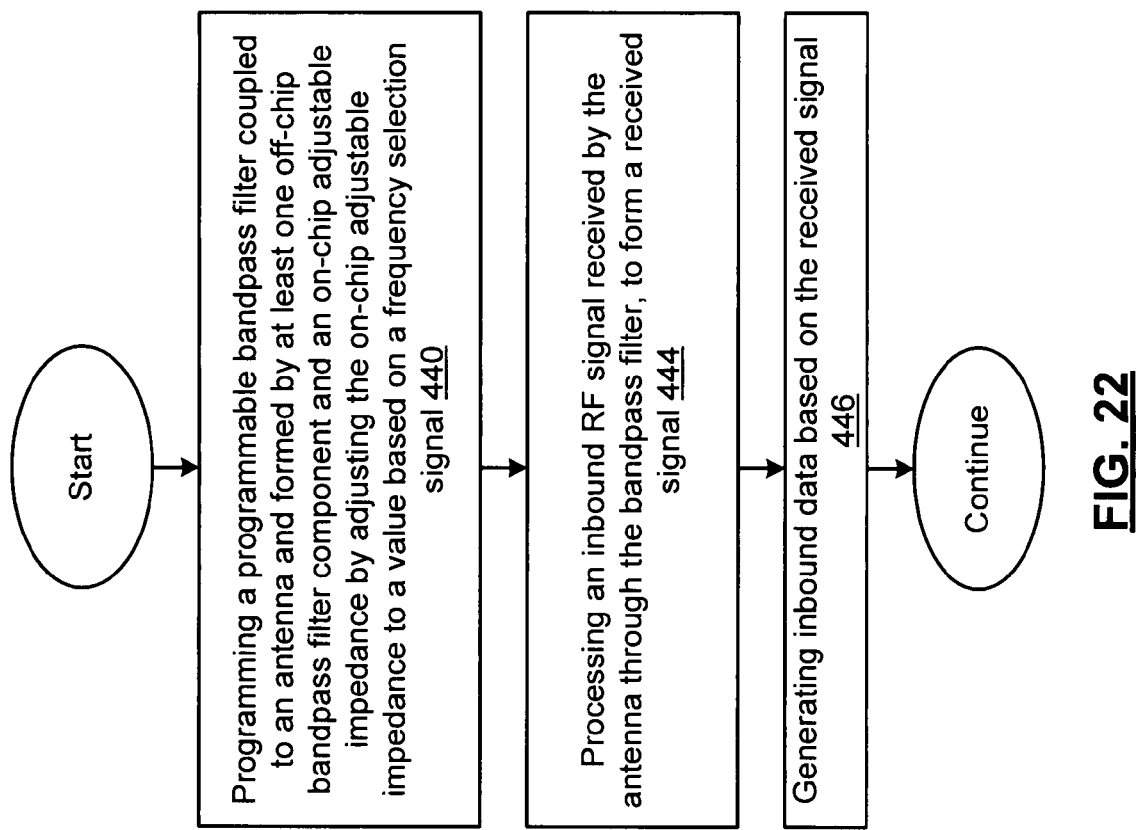
FIG. 22 is a flowchart representation of a method in accordance with an embodiment of the present invention.

FIG. 22 is a flowchart representation of a method in accordance with an embodiment of the present invention. In particular, a method is presented for use with one or more features or function discussed in conjunction with FIGS. 1-16, and that includes elements from FIG. 17 that are referred to by common reference numerals. In addition, the method includes step 444 of processing an inbound RF signal received by the antenna through the programmable band pass filter, to form a received signal. In step 446, inbound data is generated in response to the received signal.

In an embodiment of the present invention, step 446 includes demodulating the received signal at a selected one of a plurality of carrier frequencies in response to the frequency selection signal.

It should be noted that bandpass filters, such as bandpass filters 204 and programmable filter 197, have been described as implementing bandpass filtration, any of these filters could optionally be implemented with other filter configurations including highpass, lowpass or notch filters that filter undesired frequencies of with more complex filter designs that include, for instance, bandpass and notch filtration.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors discussed above may be field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A (radio frequency) RF reception system comprising:
   an off chip antenna interface that includes:
   at least one first off-chip impedance matching component coupleable to an antenna;
   a filter, coupled to the at least one first off-chip impedance matching components; and
   at least one second off-chip impedance matching component coupled to the bandpass filter;
   an integrated circuit that includes:
   an on-chip antenna interface, coupled to the off-chip antenna interface, that forms a first programmable impedance matching network with the at least one first off chip impedance matching component, and forms a second programmable impedance matching network with the at least one second off chip impedance matching component, wherein the first programmable impedance matching network is programmable based on a frequency selection signal, and wherein the second programmable impedance matching network is programmable based on the frequency selection signal; and
   an RF receiver, coupled to the second programmable impedance matching network, that generates inbound data in response to a received signal from the second programmable impedance matching network.

2. The RF reception system of claim 1 wherein the on-chip antenna interface includes:
   a first adjustable impedance coupled to the at least one first off-chip impedance matching component;
   a second adjustable impedance coupled to the at least one second off-chip impedance matching component; and
   a control module, coupled to the first adjustable impedance and the second adjustable impedance, that generates a first control signal in response to the frequency selection signal to control the first adjustable impedance to a first value and that generates a second control signal in response to the frequency selection signal to control the second adjustable impedance to a second value.

3. The RF reception system of claim 2 wherein the first adjustable impedance includes at least one adjustable reactive network element.

4. The RF reception system of claim 3 wherein the second adjustable impedance includes at least one adjustable reactive network element.

5. The RF reception system of claim 3 wherein the at least one adjustable reactive network element includes a plurality of fixed reactive network elements and a switching network for selectively coupling the plurality of fixed reactive network elements in response to the first control signal.

6. The RF reception system of claim 5 wherein the switching network selects at least one of the plurality of fixed reactive network elements and that deselects the remaining ones of the plurality of fixed reactive network elements in response to the first control signals.

7. The RF reception system of claim 1 wherein the RF receiver demodulates the received signal at a selected one of a plurality of carrier frequencies in response to the frequency selection signal.

8. The RF reception system of claim 7 wherein the filter passes each of the plurality of carrier frequencies.

9. The RF reception system of claim 1 wherein the first programmable impedance matching network includes a plurality of reactive network elements arranged in one of: and L-network configuration, a T-network configuration and a pi-network configuration.

10. The RF reception system of claim 1 wherein the second programmable impedance matching network includes a plurality of reactive network elements arranged in one of: and L-network configuration, a T-network configuration and a pi-network configuration.

11. A method for providing impedance matching in an RF communication device comprising:
    generating a frequency selection signal;
    programming a first programmable impedance matching network, coupled to an antenna and a bandpass filter, formed by at least one first off-chip impedance matching component and a first on-chip adjustable impedance by adjusting a first impedance of the first on-chip adjustable impedance based on the frequency selection signal; and
    programming a second programmable impedance matching network, coupled to the bandpass filter, formed by at least one second off-chip impedance matching component and a second on-chip adjustable impedance by adjusting a second impedance of the second on-chip adjustable impedance based on the frequency selection signal.

12. The method of claim 11 further comprising:
    processing an inbound RF signal received by the antenna through the first programmable impedance matching network, the band pass filter and the second programmable impedance matching network, to form a received signal; and generating inbound data in response to the received signal.

13. The method of claim 11 wherein the step of generating inbound data includes demodulating the received signal at a selected one of a plurality of carrier frequencies in response to the frequency selection signal.

14. The method of claim 11 wherein the step of programming the first programmable impedance matching network includes:

generating a first control signal in response to the frequency selection signal to control the first value.

15. The method of claim 14 wherein the step of programming the second programmable impedance matching network includes:

generating a second control signal in response to the frequency selection signal to control the second value.

* * * * *

UNITED STATES PATENT AND TRADEMARK OFFICE
CERTIFICATE OF CORRECTION

| | | |
|---|---|---|
| PATENT NO. | : 7,706,759 B2 | Page 1 of 1 |
| APPLICATION NO. | : 11/700829 | |
| DATED | : April 27, 2010 | |
| INVENTOR(S) | : Ahmadreza Reza Rofougaran | |

It is certified that error appears in the above-identified patent and that said Letters Patent is hereby corrected as shown below:

Title Page, Section (57), Abstract, Line 2, after "The" delete "an"
    Claim 9, Col. 18, line 41, after "one of:" delete "and" and insert --a--
    Claim 10, Col. 18, line 46, after "one of:" delete "and" and insert --a--

Signed and Sealed this
Thirteenth Day of March, 2012

David J. Kappos
*Director of the United States Patent and Trademark Office*